(12) United States Patent
Lal

(10) Patent No.: US 10,535,763 B2
(45) Date of Patent: *Jan. 14, 2020

(54) ENHANCEMENT-MODE III-NITRIDE DEVICES

(71) Applicant: Transphorm Inc., Goleta, CA (US)

(72) Inventor: Rakesh K. Lal, Isla Vista, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/029,505

(22) Filed: Jul. 6, 2018

(65) Prior Publication Data

US 2018/0315843 A1  Nov. 1, 2018

Related U.S. Application Data

(60) Continuation of application No. 15/440,404, filed on Feb. 23, 2017, now Pat. No. 10,043,898, which is a (Continued)

(51) Int. Cl.
  *H01L 29/778* (2006.01)
  *H01L 29/66* (2006.01)
  (Continued)

(52) U.S. Cl.
  CPC ...... *H01L 29/7787* (2013.01); *H01L 21/8252* (2013.01); *H01L 23/535* (2013.01);
  (Continued)

(58) Field of Classification Search
  None
  See application file for complete search history.

(56) References Cited

U.S. PATENT DOCUMENTS 4,300,091 A  11/1981  Schade, Jr.
4,532,439 A  7/1985  Koike
(Continued)

FOREIGN PATENT DOCUMENTS

CN  1596477  3/2005
CN  1748320  3/2006
(Continued)

OTHER PUBLICATIONS

Authorized officer Chung Keun Lee, International Search Report and Written Opinion in PCT/US2008/076030, dated Mar. 23, 2009, 10 pages.
(Continued)

*Primary Examiner* — Herve-Louis Y Assouman
(74) *Attorney, Agent, or Firm* — Fish & Richardson P.C.

(57) ABSTRACT

A III-N enhancement-mode transistor includes a III-N structure including a conductive channel, source and drain contacts, and a gate electrode between the source and drain contacts. An insulator layer is over the III-N structure, with a recess formed through the insulator layer in a gate region of the transistor, with the gate electrode at least partially in the recess. The transistor further includes a field plate having a portion between the gate electrode and the drain contact, the field plate being electrically connected to the source contact. The gate electrode includes an extending portion that is outside the recess and extends towards the drain contact. The separation between the conductive channel and the extending portion of the gate electrode is greater than the separation between the conductive channel and the portion of the field plate that is between the gate electrode and the drain contact.

25 Claims, 25 Drawing Sheets

Related U.S. Application Data continuation of application No. 14/714,964, filed on May 18, 2015, now Pat. No. 9,590,060, which is a division of application No. 13/799,989, filed on Mar. 13, 2013, now Pat. No. 9,087,718.

(51) Int. Cl.

| | |
|---|---|
| *H01L 29/417* | (2006.01) |
| *H01L 27/06* | (2006.01) |
| *H01L 29/40* | (2006.01) |
| *H01L 27/085* | (2006.01) |
| *H01L 21/8252* | (2006.01) |
| *H01L 27/088* | (2006.01) |
| *H01L 29/78* | (2006.01) |
| *H01L 23/535* | (2006.01) |
| *H01L 29/423* | (2006.01) |
| *H01L 29/20* | (2006.01) |
| *H01L 21/02* | (2006.01) |
| *H01L 23/29* | (2006.01) |
| *H01L 23/31* | (2006.01) |
| *H01L 23/00* | (2006.01) |
| *H01L 29/51* | (2006.01) |

(52) U.S. Cl.
CPC ...... *H01L 27/0605* (2013.01); *H01L 27/0629* (2013.01); *H01L 27/085* (2013.01); *H01L 27/0883* (2013.01); *H01L 29/404* (2013.01); *H01L 29/407* (2013.01); *H01L 29/4175* (2013.01); *H01L 29/66462* (2013.01); *H01L 29/66522* (2013.01); *H01L 29/78* (2013.01); H01L 21/0217 (2013.01); H01L 21/0254 (2013.01); H01L 23/291 (2013.01); H01L 23/3171 (2013.01); H01L 24/48 (2013.01); H01L 29/2003 (2013.01); H01L 29/4236 (2013.01); H01L 29/518 (2013.01); H01L 2224/4813 (2013.01); H01L 2224/48091 (2013.01); H01L 2924/1033 (2013.01); H01L 2924/10323 (2013.01); H01L 2924/10344 (2013.01); H01L 2924/10346 (2013.01); H01L 2924/13055 (2013.01); H01L 2924/13064 (2013.01)

(56) References Cited

U.S. PATENT DOCUMENTS

| | | |
|---|---|---|
| 4,645,562 A | 2/1987 | Liao et al. |
| 4,665,508 A | 5/1987 | Chang |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,429,468 B1 | 8/2002 | Hsu et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,552,373 B2 | 4/2003 | Ando et al. |
| 6,580,101 B2 | 6/2003 | Yoshida |
| 6,583,454 B2 | 6/2003 | Sheppard et al. |
| 6,586,781 B2 | 7/2003 | Wu et al. |
| 6,624,452 B2 | 9/2003 | Yu et al. |
| 6,633,195 B2 | 10/2003 | Baudelot et al. |
| 6,649,497 B2 | 11/2003 | Ring |
| 6,727,531 B1 | 4/2004 | Redwing et al. |
| 6,746,938 B2 | 6/2004 | Uchiyama et al. |
| 6,777,278 B2 | 8/2004 | Smith |
| 6,849,882 B2 | 2/2005 | Chavarkar et al. |
| 6,867,078 B1 | 3/2005 | Green et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,038,252 B2 | 5/2006 | Saito et al. |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,078,743 B2 | 7/2006 | Murata et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,169,634 B2 | 1/2007 | Zhao et al. |
| 7,170,111 B2 | 1/2007 | Saxler |
| 7,217,960 B2 | 5/2007 | Ueno et al. |
| 7,230,284 B2 | 6/2007 | Parikh et al. |
| 7,238,560 B2 | 7/2007 | Sheppard et al. |
| 7,250,641 B2 | 7/2007 | Saito et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,375,407 B2 | 5/2008 | Yanagihara et al. |
| 7,388,236 B2 | 6/2008 | Wu et al. |
| 7,419,892 B2 | 9/2008 | Sheppard et al. |
| 7,429,534 B2 | 9/2008 | Gaska et al. |
| 7,432,142 B2 | 10/2008 | Saxler et al. |
| 7,436,001 B2 | 10/2008 | Lee et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,501,669 B2 | 3/2009 | Parikh et al. |
| 7,501,670 B2 | 3/2009 | Murphy |
| 7,508,014 B2 | 3/2009 | Tanimoto |
| 7,544,963 B2 | 6/2009 | Saxler |
| 7,547,925 B2 | 6/2009 | Wong et al. |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,601,993 B2 | 10/2009 | Hoshi et al. |
| 7,605,017 B2 | 10/2009 | Hayashi et al. |
| 7,612,390 B2 | 11/2009 | Saxler et al. |
| 7,615,774 B2 | 11/2009 | Saxler |
| 7,629,627 B2 | 12/2009 | Mil'shtein et al. |
| 7,638,818 B2 | 12/2009 | Wu et al. |
| 7,655,962 B2 | 2/2010 | Simin et al. |
| 7,678,628 B2 | 3/2010 | Sheppard et al. |
| 7,692,263 B2 | 4/2010 | Wu et al. |
| 7,700,973 B2 | 4/2010 | Shen et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,723,739 B2 | 5/2010 | Takano et al. |
| 7,728,356 B2 | 6/2010 | Suh et al. |
| 7,745,851 B2 | 6/2010 | Harris |

(56) References Cited

U.S. PATENT DOCUMENTS

| | | | |
|---|---|---|---|
| 7,755,108 B2 | 7/2010 | Kuraguchi |
| 7,759,699 B2 | 7/2010 | Beach |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,622 B2 | 9/2010 | Kikkawa et al. |
| 7,795,642 B2 | 9/2010 | Suh et al. |
| 7,812,369 B2 | 10/2010 | Chini et al. |
| 7,834,380 B2 | 11/2010 | Ueda et al. |
| 7,851,825 B2 | 12/2010 | Suh et al. |
| 7,855,401 B2 | 12/2010 | Sheppard et al. |
| 7,859,014 B2 | 12/2010 | Nakayama et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,907 B2 | 1/2011 | Honea et al. |
| 7,875,910 B2 | 1/2011 | Sheppard et al. |
| 7,875,914 B2 | 1/2011 | Sheppard |
| 7,884,395 B2 | 2/2011 | Saito |
| 7,892,974 B2 | 2/2011 | Ring et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,932,539 B2 | 4/2011 | Chen et al. |
| 7,935,985 B2 | 5/2011 | Mishra et al. |
| 7,939,391 B2 | 5/2011 | Suh et al. |
| 7,948,011 B2 | 5/2011 | Rajan et al. |
| 7,955,918 B2 | 6/2011 | Wu et al. |
| 7,955,984 B2 | 6/2011 | Ohki |
| 7,956,383 B2 | 6/2011 | Kuroda et al. |
| 7,960,756 B2 | 6/2011 | Sheppard et al. |
| 7,961,482 B2 | 6/2011 | Ribarich |
| 7,982,242 B2 | 7/2011 | Goto |
| 7,985,986 B2 | 7/2011 | Heikman et al. |
| 8,039,352 B2 | 10/2011 | Mishra et al. |
| 8,044,380 B2 | 10/2011 | Lee |
| 8,049,252 B2 | 11/2011 | Smith et al. |
| 8,076,698 B2 | 12/2011 | Ueda et al. |
| 8,076,699 B2 | 12/2011 | Chen et al. |
| 8,110,425 B2 | 2/2012 | Yun |
| 8,153,515 B2 | 4/2012 | Saxler |
| 8,174,048 B2 | 5/2012 | Beach |
| 8,178,900 B2 | 5/2012 | Kurachi et al. |
| 8,223,458 B2 | 7/2012 | Mochizuki et al. |
| 8,237,196 B2 | 8/2012 | Saito |
| 8,237,198 B2 | 8/2012 | Wu et al. |
| 8,264,003 B2 | 9/2012 | Herman |
| 8,361,816 B2 | 1/2013 | Lee et al. |
| 8,389,975 B2 | 3/2013 | Kikuchi et al. |
| 8,389,977 B2 | 3/2013 | Chu et al. |
| 8,390,000 B2 | 3/2013 | Chu et al. |
| 8,404,042 B2 | 3/2013 | Mizuhara et al. |
| 8,431,960 B2 | 4/2013 | Beach et al. |
| 8,455,885 B2 | 6/2013 | Keller et al. |
| 8,471,267 B2 | 6/2013 | Hayashi et al. |
| 8,476,125 B2 | 7/2013 | Khan et al. |
| 8,492,779 B2 | 7/2013 | Lee |
| 8,502,323 B2 | 8/2013 | Chen |
| 8,519,438 B2 | 8/2013 | Mishra et al. |
| 8,525,231 B2 | 9/2013 | Park et al. |
| 8,530,904 B2 | 9/2013 | Treu et al. |
| 8,598,937 B2 | 12/2013 | Lal et al. |
| 8,603,880 B2 | 12/2013 | Yamada |
| 8,614,460 B2 | 12/2013 | Matsushita |
| 8,652,948 B2 | 2/2014 | Hone et al. |
| 8,674,407 B2 | 3/2014 | Ando et al. |
| 8,698,198 B2 | 4/2014 | Kuraguchi |
| 8,716,141 B2 | 5/2014 | Dora et al. |
| 8,742,460 B2 | 6/2014 | Mishra et al. |
| 8,772,832 B2 | 7/2014 | Boutros |
| 8,785,305 B2 | 7/2014 | Ramdani |
| 8,803,246 B2 | 8/2014 | Wu et al. |
| 9,087,718 B2 | 7/2015 | Lal |
| 9,590,060 B2 | 3/2017 | Lal |
| 10,043,898 B2 * | 8/2018 | Lal .................. H01L 27/0883 |
| 2003/0006437 A1 | 1/2003 | Mizuta et al. |
| 2003/0030056 A1 | 2/2003 | Callaway, Jr. |
| 2004/0041169 A1 | 3/2004 | Ren et al. |
| 2004/0119067 A1 | 6/2004 | Weeks, Jr. et al. |
| 2005/0124100 A1 | 6/2005 | Robinson |
| 2005/0133816 A1 | 6/2005 | Fan et al. |
| 2005/0189559 A1 | 9/2005 | Saito et al. |
| 2005/0189561 A1 | 9/2005 | Kinzer et al. |
| 2005/0189562 A1 | 9/2005 | Kinzer et al. |
| 2006/0043499 A1 | 3/2006 | De Cremoux et al. |
| 2006/0060871 A1 | 3/2006 | Beach |
| 2006/0076677 A1 | 4/2006 | Daubenspeck et al. |
| 2006/0102929 A1 | 5/2006 | Okamoto et al. |
| 2006/0145189 A1 | 7/2006 | Beach |
| 2006/0189109 A1 | 8/2006 | Fitzgerald |
| 2006/0202272 A1 | 9/2006 | Wu et al. |
| 2006/0226442 A1 | 10/2006 | Zhang et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0145417 A1 | 6/2007 | Brar et al. |
| 2007/0205433 A1 | 9/2007 | Parikh et al. |
| 2007/0210329 A1 | 9/2007 | Goto |
| 2007/0224710 A1 | 9/2007 | Palacios et al. |
| 2007/0228477 A1 | 10/2007 | Suzuki et al. |
| 2007/0249119 A1 | 10/2007 | Saito |
| 2007/0295985 A1 | 12/2007 | Weeks, Jr. et al. |
| 2008/0054247 A1 | 3/2008 | Eichler et al. |
| 2008/0073670 A1 | 3/2008 | Yang et al. |
| 2008/0093621 A1 | 4/2008 | Takeda et al. |
| 2008/0251837 A1 | 10/2008 | Kato et al. |
| 2008/0272397 A1 | 11/2008 | Koudymov et al. |
| 2008/0283844 A1 | 11/2008 | Hoshi et al. |
| 2008/0308813 A1 | 12/2008 | Suh et al. |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072269 A1 | 3/2009 | Suh et al. |
| 2009/0072273 A1 | 3/2009 | Briere |
| 2009/0075455 A1 | 3/2009 | Mishra |
| 2009/0085065 A1 | 4/2009 | Mishra et al. |
| 2009/0140262 A1 | 6/2009 | Ohki et al. |
| 2009/0201072 A1 | 8/2009 | Honea et al. |
| 2009/0267078 A1 | 10/2009 | Mishra et al. |
| 2009/0278144 A1 | 11/2009 | Sonobe et al. |
| 2010/0044752 A1 | 2/2010 | Marui |
| 2010/0065923 A1 | 3/2010 | Charles et al. |
| 2010/0067275 A1 | 3/2010 | Wang et al. |
| 2010/0133506 A1 | 6/2010 | Nakanishi et al. |
| 2010/0201439 A1 | 8/2010 | Wu et al. |
| 2010/0203234 A1 | 8/2010 | Anderson et al. |
| 2010/0219445 A1 | 9/2010 | Yokoyama et al. |
| 2011/0012110 A1 | 1/2011 | Sazawa et al. |
| 2011/0049526 A1 | 3/2011 | Chu et al. |
| 2011/0062438 A1 | 3/2011 | Kaneko |
| 2011/0127541 A1 | 6/2011 | Wu et al. |
| 2011/0193619 A1 | 8/2011 | Parikh et al. |
| 2011/0221011 A1 | 9/2011 | Bahat-Treidel et al. |
| 2012/0126287 A1 | 5/2012 | Aoki |
| 2012/0217512 A1 | 8/2012 | Renaud |
| 2012/0218783 A1 | 8/2012 | Imada |
| 2012/0235210 A1 | 9/2012 | Takemae et al. |
| 2012/0267637 A1 | 10/2012 | Jeon et al. |
| 2012/0273795 A1 | 11/2012 | Li |
| 2013/0020614 A1 | 1/2013 | Lu et al. |
| 2013/0056744 A1 | 3/2013 | Mishra et al. |
| 2013/0069117 A1 | 3/2013 | Yoshioka et al. |
| 2013/0228827 A1 | 9/2013 | Takemae et al. |
| 2013/0328061 A1 | 12/2013 | Chu et al. |
| 2014/0084346 A1 | 3/2014 | Tajiri |
| 2014/0099757 A1 | 4/2014 | Parikh et al. |

(56) References Cited

U.S. PATENT DOCUMENTS

| | | |
|---|---|---|
| 2014/0264370 A1 | 9/2014 | Keller et al. |
| 2014/0264431 A1 | 9/2014 | Lal |
| 2014/0264455 A1 | 9/2014 | Keller et al. |
| 2015/0263112 A1 | 9/2015 | Lal et al. |
| 2017/0162684 A1 | 6/2017 | Lal |

FOREIGN PATENT DOCUMENTS

| | | |
|---|---|---|
| CN | 101095233 | 12/2007 |
| CN | 101107713 | 1/2008 |
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 09-306926 | 11/1997 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-253620 | 9/2004 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-505501 | 3/2007 |
| JP | 2007-215331 | 8/2007 |
| JP | 2008-091699 | 4/2008 |
| JP | 2008-199771 | 8/2008 |
| JP | 2008-243848 | 10/2008 |
| JP | 2009-503815 | 1/2009 |
| JP | 2009-524242 | 6/2009 |
| JP | 2010-087076 | 4/2010 |
| JP | 2010-525023 | 7/2010 |
| JP | 2010-539712 | 12/2010 |
| JP | 2012-199285 | 10/2012 |
| JP | 2012-231003 | 11/2012 |
| JP | 2013-503483 | 1/2013 |
| JP | 2013-026442 | 2/2013 |
| JP | 2013-041975 | 2/2013 |
| JP | 2013-069785 | 4/2013 |
| KR | 2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Yolaine Cussac, International Preliminary Report on Patentability in PCT/US2008/076030, dated Mar. 25, 2010, 5 pages.

Authorized officer Chung Keun Lee, International Search Report and Written Opinion in PCT/US2008/076079, dated Mar. 20, 2009, 11 pages.

Authorized officer Nora Lindner, International Preliminary Report on Patentability in PCT/US2008/076079, dated Apr. 1, 2010, 6 pages.

Authorized officer Keon Hyeong Kim, International Search Report and Written Opinion in PCT/US2008/076160 dated Mar. 18, 2009, 11 pages.

Authorized officer Simin Baharlou, International Preliminary Report on Patentability in PCT/US2008/076160, dated Mar. 25, 2010, 6 pages.

Authorized officer Chung Keun Lee, International Search Report and Written Opinion in PCT/US2008/076199, dated Mar. 24, 2009, 11 pages.

Authorized officer Dorothée Mülhausen, International Preliminary Report on Patentability in PCT/US2008/076199, dated Apr. 1, 2010, 6 pages.

Authorized officer Keon Hyeong Kim, International Search Report and Written Opinion in PCT/US2008/085031, dated Jun. 24, 2009, 11 pages.

Authorized officer Yolaine Cussac, International Preliminary Report on Patentability in PCT/US2008/085031, dated Jun. 24, 2010, 6 pages.

Authorized officer Tae Hoon Kim, International Search Report and Written Opinion in PCT/US2009/041304, dated Dec. 18, 2009, 13 pages.

Authorized officer Dorothée Mülhausen, International Preliminary Report on Patentability, in PCT/US2009/041304, dated Nov. 4, 2010, 8 pages.

Authorized officer Sung Hee Kim, International Search Report and the Written Opinion in PCT/US2009/057554, dated May 10, 2010, 13 pages.

Authorized Officer Gijsbertus Beijer, International Preliminary Report on Patentability in PCT/US2009/057554, dated Mar. 29, 2011, 7 pages.

Authorized officer Cheon Whan Cho, International Search Report and Written Opinion in PCT/US2009/066647, dated Jul. 1, 2010, 16 pages.

Authorized officer Athina Nikitas-Etienne, International Preliminary Report on Patentability in PCT/US2009/066647, dated Jun. 23, 2011, 12 pages.

Authorized officer Sung Chan Chung, International Search Report and Written Opinion for PCT/US2010/021824, dated Aug. 23, 2010, 9 pages.

Authorized officer Beate Giffo-Schmitt, International Preliminary Report on Patentability in PCT/US2010/021824, dated Aug. 18, 2011, 6 pages.

Authorized officer Sang Ho Lee, International Search Report and Written Opinion in PCT/US2010/034579, dated Dec. 24, 2010, 9 pages.

Authorized officer Nora Lindner, International Preliminary Report on Patentability in PCT/US2010/034579, dated Nov. 24, 2011, 7 pages.

Authorized officer Jeongmin Choi, International Search Report and Written Opinion in PCT/US2010/046193, dated Apr. 26, 2011, 13 pages.

Authorized officer Philippe Bécamel, International Preliminary Report on Patentability in PCT/US2010/046193, dated Mar. 8, 2012, 10 pages.

Authorized officer Sang Ho Lee, International Search Report and Written Opinion in PCT/US2010/059486, dated Jul. 26, 2011, 9 pages.

Authorized officer Nora Lindner, International Preliminary Report on Patentability in PCT/US2010/059486, dated Jun. 21, 2012, 6 pages.

(56) References Cited

OTHER PUBLICATIONS

Authorized officer Kwan Sik Sul, International Search Report and Written Opinion in PCT/US2011/063975, dated May 18, 2012, 8 pages.
Authorized officer Simin Baharlou, International Preliminary Report on Patentability in PCT/US2011/063975, dated Jun. 27, 2013, 5 pages.
Authorized officer Sang-Taek Kim, International Search Report and Written Opinion in PCT/US2011/061407, dated May 22, 2012, 10 pages.
Authorized officer Lingfei Bai, International Preliminary Report on Patentability in PCT/US2011/061407, dated Jun. 6, 2013, 7 pages.
Authorized officer Kwan Sik Sul, International Search Report and Written Opinion in PCT/US2012/023160, dated May 24, 2012, 9 pages.
Authorized officer Simin Baharlou, International Preliminary Report on Patentability in PCT/US2012/023160, dated Aug. 15, 2013, 6 pages.
Authorized officer Jeongmin Choi, International Search Report and Written Opinion in PCT/US2012/027146, dated Sep. 24, 2012, 12 pages.
Authorized officer Athina Nickitas-Etienne, International Preliminary Report on Patentability in PCT/US2012/027146, dated Sep. 19, 2013, 9 pages.
Authorized officer Tae Hoon Kim, International Search Report and Written Opinion in PCT/US2013/035837, dated Jul. 30, 2013, 9 pages.
Authorized officer Hye Lyun Park, International Search Report and Written Opinion in PCT/US2013/050914, dated Oct. 18, 2013, 11 pages.
Authorized officer Jun. Young Son, International Search Report and Written Opinion in PCT/US2014/024191, dated Aug. 7, 2014, 11 pages.
Authorized officer Kihwan Moon, International Preliminary Report on Patentability in PCT/US2014/024191, dated Sep. 24, 2015, 8 pages.
Authorized officer June Young Son, International Search Report and Written Opinion in PCT/US2014/016298, dated May 23, 2014, 15 pages.
Authorized officer Kihwan Moon, International Preliminary Report on Patentability in PCT/US2014/016298, dated Aug. 27, 2015, 12 pages.
Authorized officer June Young Son, International Search Report and Written Opinion in PCT/US2014/046030, dated Oct. 21, 2014, 12 pages.
Authorized officer Agnès Wittmann-Regis, International Preliminary Report on Patentability in PCT/US2014/046030, dated Jan. 28, 2016, 9 pages.
Authorized officer Tae Hoon Kim, International Search Report and Written Opinion in PCT/US2014/027523, dated Jul. 30, 2014, 14 pages.
Authorized officer Nora Lindner, International Preliminary Report on Patentability in PCT/US2014/027523, dated Sep. 24, 2015, 11 pages.
Authorized officer Sang Won Choi, International Search Report and Written Opinion in PCT/US2013/024470, dated May 27, 2013, 12 pages.
Authorized officer Simin Baharlou, International Preliminary Report on Patentability in PCT/US2013/024470, dated Aug. 14, 2014, 9 pages.
Authorized officer Sang Won Choi, International Search Report and Written Opinion in PCT/US2013/048275, dated Oct. 14, 2013, 17 pages.
Authorized officer Simin Baharlou, International Preliminary Report on Patentability in PCT/US2013/048275, dated Jan. 8, 2015, 14 pages.
Examiner Sebastian Moehl, European Search Report in Application No. 10 81 5813.0, dated Mar. 12, 2013, 9 pages.
Search Report and Action in TW Application No. 098132132, dated Dec. 6, 2012, 8 pages.
Chinese First Office Action for Application No. 200880120050.6, dated Aug. 2, 2011, 10 pages.
Chinese First Office Action for Application No. 200980114639.X, dated May 14, 2012, 13 pages.
Search Report and Action in TW Application No. 098141930, dated Jul. 10, 2014, 7 pages.
Ando et al., "10-W/mm AlGaN—GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.
Chen et al., "High-performance AlGaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H—SiC Substrates with Current-Gain Cutoff Frequency of 190 GHz," Applied Physics Express, 2008, 021103-1-3.
Hwang et al., "Effects of a Molecular Beam Epitaxy Grown an Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN—GaN Junctions with Ultrathin AlN Interlayers: Expanding Heterojunction Design," Applied Physics Letters, 2002, 80(23):4387-4389.

(56) References Cited

OTHER PUBLICATIONS

Keller et al., "Method for Heteroepitaxial Growth of High Quality N-Face GaN, InN and AlN and their Alloys by Metal Organic Chemical Vapor Deposition," U.S. Appl. No. 60/866,035, filed Nov. 15, 2006, 31 pages.
Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage," Electronic Letters, 2005, 41(7):449-450.
Lee et al., "Self-aligned Process for Emitter- and Base-regrowth GaN HBTs and BJTs," Solid-State Electronics, 2001, 45:243-247.
Marchand et al., "Metalorganic Chemical Vapor Deposition on GaN on Si(111): Stress Control and Application to Filed-effect Transistors," Journal of Applied Physics, 2001, 89(12):7846-7851.
Mishra et al., "N-face High Electron Mobility Transistors with Low Buffer Leakage and Low Parasitic Resistance," U.S. Appl. No. 60/908,914, filed Mar. 29, 2007, 21 pages.
Mishra et al., "Polarization-induced Barriers for N-face Nitride-based Electronics," U.S. Appl. No. 60/940,052, filed May 24, 2007, 29 pages.
Mishra et al., "Growing N-polar III-nitride structures," U.S. Appl. No. 60/972,467, filed Sep. 14, 2007, 7 pages.
Mishra et al., "AlGaN/GaN HEMTs—An Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters 92 (2008), 3 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Ota and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, DRC '05 63rd, pp. 181-182.
Palacios et al., "AlGaN/GaN High Electron Mobility Transistors with InGaN Back-Barriers," IEEE Electron Device Letters, 2006, 27(1):13-15.
Palacios et al., "Fluorine Treatment to Shape the Electric Field in Electron Devices, Passivate Dislocations and Point Defects, and Enhance the Luminescence Efficiency of Optical Devoces," U.S. Appl. No. 60/736,628, filed Nov. 15, 2005, 21 pages.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
"Planar, Low Switching Loss, Gallium Nitride Devices for Power Conversion Applications," SBIR N121-090 (Navy), 2012, 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Reiher et al., "Efficient Stress Relief in GaN Heteroepitaxy on Si(111) Using Low-temperature AlN Interlayers," Journal of Crystal Growth, 2003, 248:563-567.
Saito et al., "Recessed-gate Structure Approach Toward Normally Off High-voltage AlGaN/GaN HEMT for Power Electronics Applications," IEEE Transactions on Electron Device, 2006, 53(2):356-362.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
Shen, "Advanced Polarization-based Design of AlGaN/GaN HEMTs," Jun. 2004, PhD Thesis, University of California, Santa Barbara, 192 pages.
Sugiura et al., "Enhancement-mode n-channel GaN MOSFETs Fabricated on p-GaN Using $HfO_2$ as Gate Oxide," Electronics Letters, 2007, vol. 43, No. 17, 2 pages.
Suh et al., "High Breakdown Enhancement Mode GaN-based HEMTs with Integrated Slant Field Plate," U.S. Appl. No. 60/822,886, filed Aug. 18, 2006, 16 pages.
Suh et al. "High-Breakdown Enhancement-mode AlGaN/GaN HEMTs with Integrated Slant Field-Plate," Electron Devices Meeting, 2006, IEDM '06 International, 3 pages.
Suh et al., "III-Nitride Devices with Recessed Gates," U.S. Appl. No. 60/972,481, filed Sep. 14, 2007, 18 pages.
Tipirneni et al. "Silicon Dioxide-encapsulated High-Voltage AlGaN/GaN HFETs for Power-Switching Applications," IEEE Electron Device Letters, 2007, 28(9):784-786.
Vetury et al., "Direct Measurement of Gate Depletion in High Breakdown (405V) Al/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.
Wang et al., "Demonstration of Submicron Depletion-mode GaAs MOSFET's with Negligible Drain Current Drift and Hysteresis," IEEE Electron Device Letters, 1999, 20(9):457-569.
Wu, "AlGaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1MHz,"Electronic Device Letters, 2008, IEEE, 29(8):824-826.
Yoshida, "AlGan/GaN Power FET," Furukawa Review, 2002, 21:7-11.
Zhang, "High Voltage GaN HEMTs with Low on-resistance for Switching Applications," PhD Thesis, University of California, Santa Barbara, Sep. 2002, 166 pages.
Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.
Authorized officer Agnès Wittmann-Regis, International Preliminary Report on Patentability in PCT/US2013/035837, dated Oct. 23, 2014, 6 pages.
Authorized officer Yukari Nakamura, International Preliminary Report on Patentability in PCT/US2013/050914, dated Jan. 29, 2015, 8 pages.
Notice of Reasons for Rejection in JP Application No. 2016-501433, dated Nov. 14, 2017, 20 pages.
Official Letter for TW Application No. 103109139, dated Jan. 5, 2018, 10 pages.

* cited by examiner

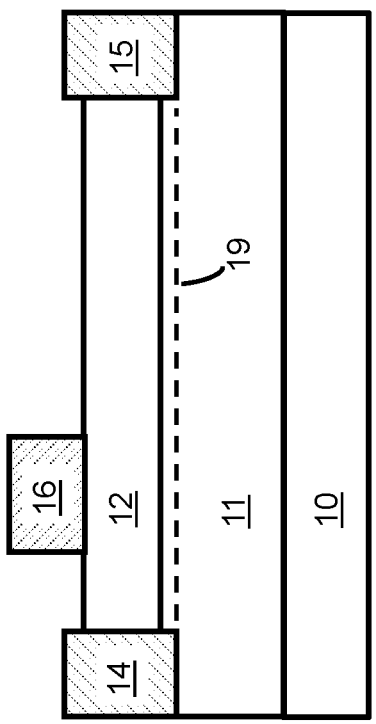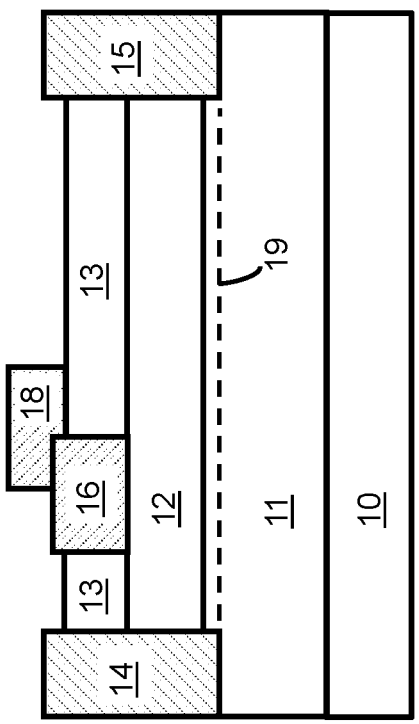

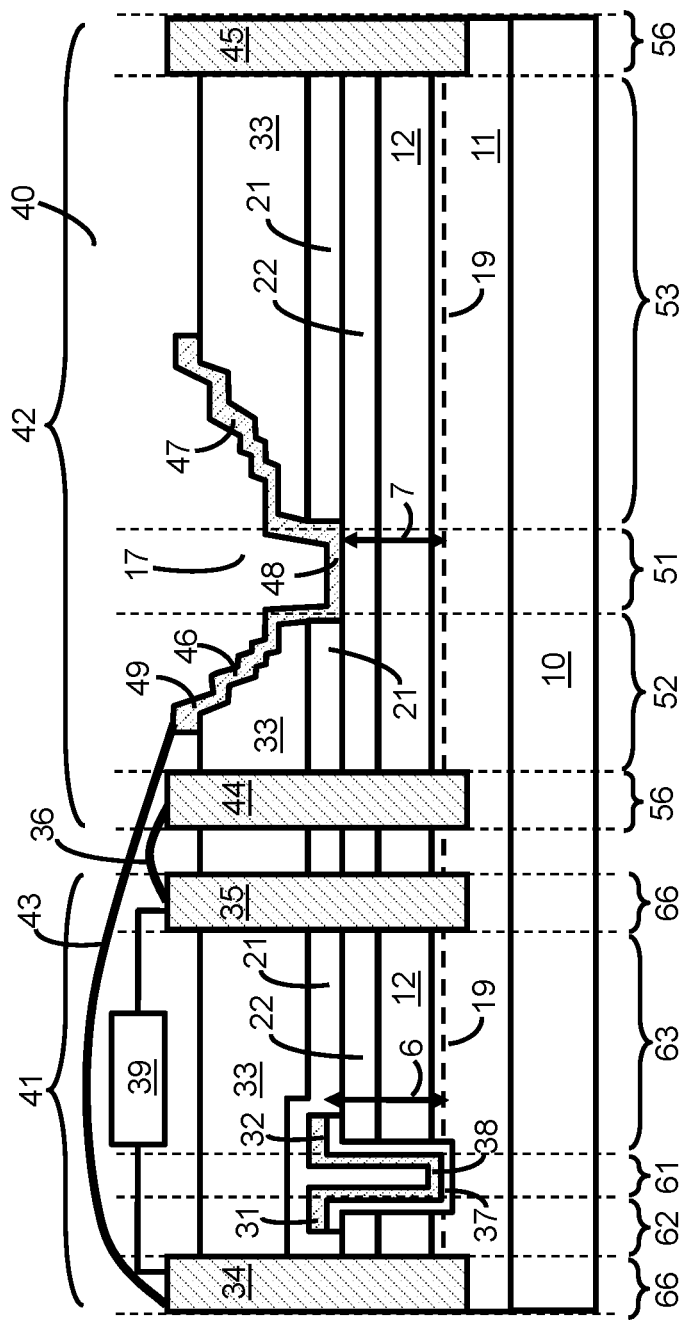
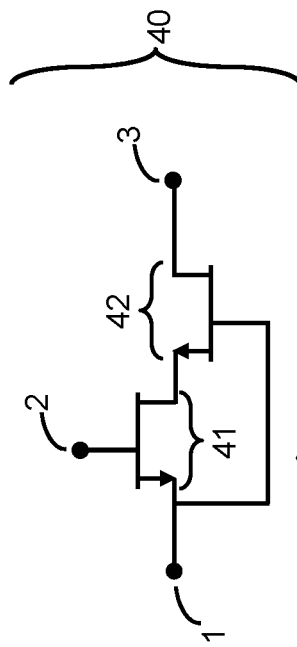
Figure 5A
Figure 5B

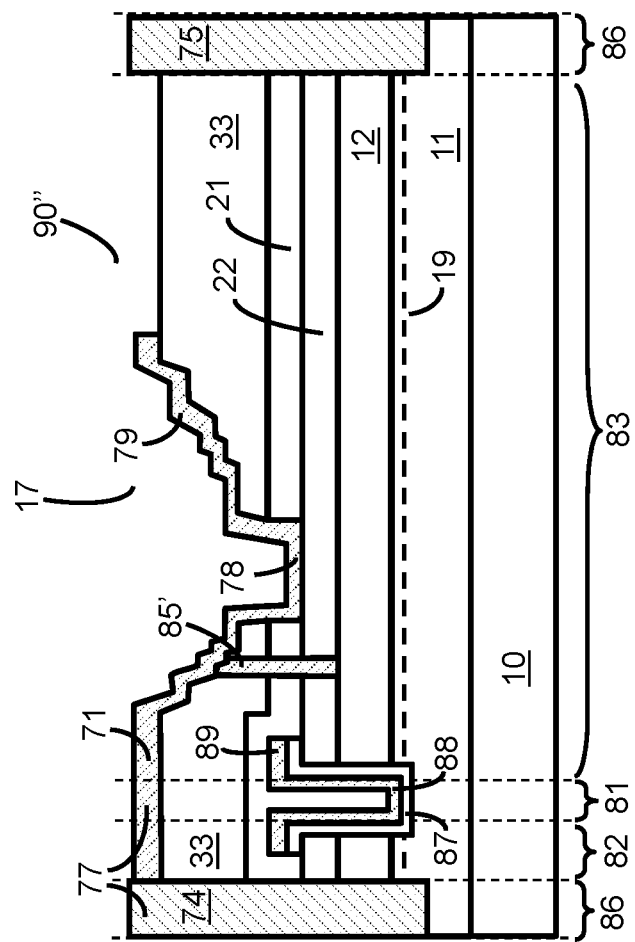

ENHANCEMENT-MODE III-NITRIDE DEVICES

CROSS-REFERENCE TO RELATED APPLICATIONS

This is a continuation application of U.S. application Ser. No. 15/440,404, filed on Feb. 23, 2017, which is a continuation of U.S. application Ser. No. 14/714,964, filed on May 18, 2015 (now U.S. Pat. No. 9,590,060), which is a divisional application of U.S. application Ser. No. 13/799,989, filed on Mar. 13, 2013 (now U.S. Pat. No. 9,087,718). The disclosures of the prior applications are considered part of and are incorporated by reference in the disclosure of this application.

STATEMENT REGARDING FEDERALLY SPONSORED RESEARCH OR DEVELOPMENT

This invention was made with Government support awarded by ARPA-E [Award #DE-AR0000212]. The Government has certain rights in this invention, including the right to revoke or modify the license to manufacture if the recipient is unable to expeditiously realize practical applications.

TECHNICAL FIELD

This invention relates to semiconductor electronic devices, specifically devices with electrodes connected to field plates.

BACKGROUND

Most power semiconductor devices such as high-voltage P-I-N diodes and power transistors such as power MOSFETs and Insulated Gate Bipolar Transistors (IGBT) have been typically fabricated with silicon (Si) semiconductor materials. More recently, silicon carbide (SiC) power devices have been used due to their superior properties. III-Nitride (III-N) semiconductor devices are emerging as an attractive candidate to carry large currents and support high voltages, and provide very low on resistance, high voltage operation, and fast switching times. As used herein, the terms III-N or III-Nitride materials, layers, devices, etc., refer to a material or device comprised of a compound semiconductor material according to the stoichiometric formula $B_w Al_x In_y Ga_z N$, where w+x+y+z is about 1.

Examples of III-N high electron mobility transistors (HEMTs) of the prior art are shown in FIGS. 1 and 2. The III-N HEMT of FIG. 1 includes a substrate 10, a III-N channel layer 11, such as a layer of GaN, atop the substrate, and a III-N barrier layer 12, such as a layer of $Al_x Ga_{1-x} N$, atop the channel layer. A two-dimensional electron gas (2DEG) channel 19 is induced in the channel layer 11 near the interface between the channel layer 11 and the barrier layer 12. Source and drain contacts 14 and 15, respectively, form ohmic contacts to the 2DEG channel. Gate contact 16 modulates the portion of the 2DEG in the gate region, i.e., directly beneath gate contact 16.

Field plates are commonly used in III-N devices to shape the electric field in the high-field region of the device in such a way that reduces the peak electric field and increases the device breakdown voltage, thereby allowing for higher voltage operation. An example of a field plated III-N HEMT of the prior art is shown in FIG. 2. In addition to the layers included in the device of FIG. 1, the device in FIG. 2 includes a field plate 18 which is connected to gate 16, and an insulator layer 13, such as a layer of SiN, is between the field plate 18 and the III-N barrier layer 12. Field plate 18 can include or be formed of the same material as gate 16. Insulator layer 13 can act as a surface passivation layer, preventing or suppressing voltage fluctuations at the surface of the III-N material adjacent to insulator layer 13.

Slant field plates have been shown to be particularly effective in reducing the peak electric field and increasing the breakdown voltage in III-N devices. A prior art III-N device similar to that of FIG. 2, but with a slant field plate 24, is shown in FIG. 3. In this device, gate 16 (i.e., the portion of electrode 29 that is between the vertical dashed lines) and slant field plate 24 are formed of a single electrode 29. Electrode-defining layer 23 is an insulating layer, such as SiN, that contains a recess which defines at least in part the shape of electrode 29. Electrode-defining layer 23 can also act as a surface passivation layer, preventing or suppressing voltage fluctuations at the surface of the III-N material adjacent to electrode-defining layer 23. Gate 16 and slant field plate 24 in this device can be formed by first depositing electrode-defining layer 23 over the entire surface of III-N barrier layer 12, then etching a recess through the electrode-defining layer 23 in the region containing gate 16, the recess including a slanted sidewall 25, and finally depositing electrode 29 at least in the recess and over the slanted sidewall 25.

Slant field plates, such as field plate 24 in FIG. 3, tend to spread the electric fields in the device over a larger volume as compared to conventional field plates, such as field plate 18 in FIG. 2, which do not include a slanted portion. Hence, slant field plates tend to be more effective at reducing the peak electric field in the underlying device, thereby allowing for larger operating and breakdown voltages.

The III-N HEMTs shown in FIGS. 1-3 are depletion-mode (i.e., D-mode), or normally-on devices. That is, they are in the ON (conductive) state when 0V is applied to the gate relative to the source and a positive voltage is applied to the drain relative to the source. In order to turn the devices OFF such that they are in a non-conductive state, a sufficiently negative voltage must be applied to the gate relative to the source. In many applications, it is desirable to utilize enhancement-mode (or E-mode) devices, i.e., devices with a positive threshold voltage, as this can simplify the form of the signals applied by the gate-drive circuit to the device and can prevent accidental turn on of the device in case of device or circuit failure.

Reliable fabrication and manufacturing of high-voltage III-N E-mode devices has thus far proven to be very difficult. One prior art alternative to a single high-voltage III-N E-mode device is to combine a high-voltage III-N D-mode device with a low-voltage silicon-based E-mode device in the configuration of FIG. 4 to form a hybrid device, which in many cases achieves the same or similar output characteristics as a single high-voltage E-mode device. The hybrid device of FIG. 4 includes a high-voltage III-N D-mode transistor 5 and a low-voltage silicon-based E-mode transistor 4. Node 1 serves as the source of the hybrid device, node 2 serves as the gate of the hybrid device, and node 3 serves as the drain of the hybrid device. The source electrode of the low-voltage E-mode transistor 4 and the gate electrode of the high-voltage D-mode transistor 5 are both electrically connected to the source node 1. The gate electrode of the low-voltage E-mode transistor 4 is electrically connected to the gate node 2. The drain electrode of the high-voltage D-mode transistor 5 is electrically connected to the drain node 3. The source electrode of the high-voltage D-mode transistor 5 is electrically connected to the drain electrode of the low-voltage E-mode transistor 4. When gate node 2 is biased relative to source node 1 at a voltage higher than the threshold voltage of E-mode transistor 4, the hybrid device is in the ON state, and conducts current between source and drain nodes 1 and 3, respectively, when a positive voltage is applied to the drain node 3 relative to the source node 1. When gate node 2 is biased relative to source node 1 at zero volts or at another voltage which is lower than the threshold voltage of E-mode transistor 4, the hybrid device is in the OFF state. In the OFF state, the hybrid device does not conduct substantial current between source and drain nodes 1 and 3, respectively, when a positive voltage is applied to the drain node 3 relative to the source node 1. In this state, the hybrid device is capable of supporting any drain-source voltages which are less than or equal to the breakdown voltage of the high-voltage D-mode transistor 5.

SUMMARY

In a first aspect, a III-N device is described. The III-N device comprises a III-N enhancement-mode transistor including a source contact and a first gate, the first gate being on a gate insulator, and a III-N depletion-mode transistor including a drain contact. The III-N device also includes a III-N structure including a conductive channel, where a first portion of the conductive channel serves as a device channel of the III-N enhancement-mode transistor, and a second portion of the conductive channel serves as a device channel of the III-N depletion-mode transistor. The III-N device further includes an insulator layer over the III-N structure, where a first recess is formed through the insulator layer in a gate region of the III-N enhancement-mode transistor, and the gate insulator and the first gate are at least partially in the recess. The III-N device also includes an electrode-defining layer having a thickness, the electrode-defining layer being over the insulator layer, with a second recess being formed in the electrode-defining layer in a gate region of the III-N depletion-mode transistor, the second recess including a sidewall proximal to the drain contact. The III-N device further includes an electrode in the second recess, the electrode including a second gate of the III-N depletion-mode transistor and an extending portion, the second gate being in a gate region of the III-N depletion-mode transistor, and the extending portion being at least partially over the sidewall. Additionally, the electrode is electrically connected to the source contact.

In a second aspect, a III-N enhancement-mode transistor is described. The transistor comprises a III-N structure including a conductive channel therein, a source contact and a drain contact, the source and drain contacts electrically contacting the conductive channel, and a gate electrode positioned between the source and drain contacts. The transistor also includes an insulator layer over the III-N structure, where a recess is formed through the insulator layer in a gate region of the III-N enhancement-mode transistor, and the gate electrode is at least partially in the recess. The transistor further includes a field plate having a portion that is between the gate electrode and the drain contact, the field plate being electrically connected to the source contact. The gate electrode includes an extending portion that is outside the recess and extends towards the drain contact, and a separation between the conductive channel and the extending portion of the gate electrode is greater than a separation between the conductive channel and the portion of the field plate that is between the gate electrode and the drain contact.

In a third aspect, another enhancement-mode transistor is described. The transistor comprises a semiconductor material structure including a conductive channel therein, and a source contact and a drain contact, with the source and drain contacts electrically contacting the conductive channel. The transistor also includes a gate electrode positioned between the source and drain contacts, a field plate that is electrically connected to the source contact, and a diode, with a first side of the diode electrically connected to the field plate.

In a fourth aspect, a half bridge is described. The half bridge comprises a III-N structure including a conductive channel therein, and a first gate electrode and a second gate electrode, the first and second gate electrodes being on the III-N structure. The half bridge also includes a first source contact and a drain contact, the first source contact and the drain contact electrically contacting the conductive channel, and the first and second gate electrodes are both between the first source contact and the drain contact. The half bridge further includes a second source contact, the second source contact including a first portion electrically contacting the conductive channel, wherein the first portion of the second source contact is between the first gate electrode and the second gate electrode. Additionally, the first source contact is part of a first electrode and the second source contact is part of a second electrode, the first electrode including a portion which is between the first gate electrode and the second source contact, and the second electrode including a portion that is between the second gate electrode and the drain contact.

In a fifth aspect, a bidirectional switch is described. The bidirectional switch comprises a III-N structure including a conductive channel therein, and a first gate electrode and a second gate electrode, the first and second gate electrodes being on the III-N structure. The bidirectional switch also includes a first source contact and a second source contact, the first source and second source contacts electrically contacting the conductive channel, where the first and second gate electrodes are each between the first and second source contacts. Furthermore, the first source contact is part of a first electrode and the second source contact is part of a second electrode, the first electrode including a first portion which is between the first and second gate electrodes, and the second electrode including a second portion that is between the first and second gate electrodes.

Each of the devices, transistors, half bridges, and bidirectional switches described herein can include one or more of the following features. A portion of the second recess distal from the III-N structure can have a first width and a portion of the second recess proximal to the III-N structure can have a second width, the first width being larger than the second width. A breakdown voltage of the III-N depletion-mode transistor can be at least 3 times a breakdown voltage of the III-N enhancement-mode transistor. The device can be configured to function as an enhancement-mode transistor having a breakdown voltage which is at least 3 times the breakdown voltage of the III-N enhancement-mode transistor. The electrode-defining layer can be over both the device channel of the III-N enhancement-mode transistor and the device channel of the III-N depletion-mode transistor. The first gate can include an extending portion that is outside the first recess and extends towards the drain contact. A separation between the conductive channel and the extending portion of the first gate can be greater than a separation between the conductive channel and the second gate. The first recess can extend into the III-N structure. The first recess can extend through the conductive channel.

The III-N structure can comprise a first III-N layer and a second III-N layer, wherein the conductive channel is a 2DEG channel induced in the first III-N layer adjacent to the second III-N layer as a result of a compositional difference between the first III-N layer and the second III-N layer. The second recess can extend completely through the thickness of the electrode-defining layer. The electrode-defining layer can comprise $SiN_x$. The device can further include an additional dielectric layer between the insulator layer and the electrode-defining layer. The additional dielectric layer can comprise AlN, and the insulator layer can comprise SiN. The sidewall can include a plurality of steps. The device can further comprise an additional contact between the first gate and the second gate, the additional contact contacting the conductive channel. The device can further comprise a current-carrying component, wherein a first side of the current-carrying component is electrically connected to the source contact and a second side of the current-carrying component is electrically connected to the additional contact. The current-carrying component can comprise a diode, with the first side of the current-carrying component being an anode, and the second side of the current-carrying component being a cathode. The current-carrying component can comprise a resistor. The III-N enhancement-mode transistor can lack a drain contact, the III-N depletion-mode transistor can lack a source contact, and the III-N enhancement-mode transistor and III-N depletion-mode transistor can share a common drift region between the first gate and the second gate.

The device can further comprise an additional contact between the gate electrode and the drain electrode. The additional contact can electrically contact the conductive channel. The device can further comprise a diode, wherein a first side of the diode is electrically connected to the field plate and a second side of the diode is electrically connected to the additional contact. The first side of the diode can be an anode and the second side of the diode can be a cathode. The semiconductor material structure can comprise one or more III-Nitride layers, with the conductive channel in the one or more III-Nitride layers. The device can further comprise an additional contact between the gate electrode and the drain electrode. The additional contact can electrically contact the conductive channel. A second side of the diode can be electrically connected to the additional contact. The gate electrode can include a main gate portion and an extending portion, the extending portion extending from the main gate portion towards the drain contact, the field plate can include a portion which is between the extending portion and the drain contact, and a separation between the conductive channel and the extending portion of the gate electrode can be greater than a separation between the conductive channel and the portion of the field plate which is between the extending portion and the drain contact.

The device or half bridge can further comprise an additional contact between the first gate electrode and the drain contact, as well as a diode having an anode and a cathode, wherein the anode is electrically connected to the first electrode or to the second electrode, and the cathode is electrically connected to the additional contact. The additional contact can electrically contact the conductive channel. The first gate can be part of a first III-N switch and the second gate can be part of a second III-N switch. The half bridge or device can further comprise an additional contact between the first gate electrode and the second source contact, as well as a diode having an anode and a cathode, wherein the anode is electrically connected to the first electrode and the cathode is electrically connected to the additional contact. A reverse bias breakdown voltage of the diode can be smaller than a breakdown voltage of the first III-N switch. The reverse bias breakdown voltage of the diode can be less than 0.5 times the breakdown voltage of the first III-N switch. The second electrode can be configured to operate as a drain of the first III-N switch.

The first gate electrode can include a main gate portion and an extending portion, the extending portion can extend from the main gate portion towards the drain contact, and a separation between the conductive channel and the extending portion of the first gate electrode can be greater than a separation between the conductive channel and the portion of the first electrode which is between the first gate electrode and the second source contact. The half bridge can further comprise an insulating material over the III-N structure, the insulating material including a first recess and a second recess, wherein the portion of the first electrode which is between the first gate electrode and the second source contact is in the first recess, and the portion of the second electrode which is between the second gate electrode and the drain contact is in the second recess.

The bidirectional switch or device can further comprise a first additional contact between the first gate electrode and the second gate electrode, as well as a first diode having an first anode and a first cathode, wherein the first anode is electrically connected to the first electrode and the first cathode is electrically connected to the first additional contact. The additional contact can electrically contact the conductive channel. The bidirectional switch or device can further comprise a second additional contact between the first gate and second gate electrodes and a second diode having a second anode and a second cathode, wherein the second anode is electrically connected to the second electrode and the second cathode is electrically connected to the second additional contact. A reverse bias breakdown voltage of the diode can be smaller than a breakdown voltage of the device or bidirectional switch. The reverse bias breakdown voltage of the diode can be less than 0.3 times the breakdown voltage of the device or bidirectional switch.

The first gate electrode can include a main gate portion and an extending portion, the extending portion extending from the main gate portion towards the second gate electrode, wherein a separation between the conductive channel and the extending portion of the first gate electrode is greater than a separation between the conductive channel and the first portion of the first electrode. The bidirectional switch or device can further comprise an insulating material over the III-N structure, the insulating material including a first recess and a second recess, wherein the first portion of the first electrode is in the first recess, and the second portion of the second electrode is in the second recess.

III-N devices which can be fabricated reproducibly, can support high voltages with low leakage, and at the same time can exhibit low on-resistance and high breakdown voltage, are described. Methods of forming the devices are also described. The III-N devices described herein can be transistors, half bridges, and/or bidirectional switches, and can be high-voltage devices suitable for high voltage applications. The details of one or more implementations of the invention are set forth in the accompanying drawings and description below. Other features and advantages of the invention will be apparent from the description and drawings, and from the claims.

DESCRIPTION OF DRAWINGS

FIGS. 1-3 are cross-sectional views of III-N HEMT devices of the prior art.

FIG. 5A is a cross-sectional view of an implementation of a III-N device.

FIG. 5B is a circuit representation of the device of FIG. 5A.

FIG. 10D is a cross-sectional view of yet another implementation of a III-N device.

Like reference symbols in the various drawings indicate like elements.

DETAILED DESCRIPTION

Figure 3:
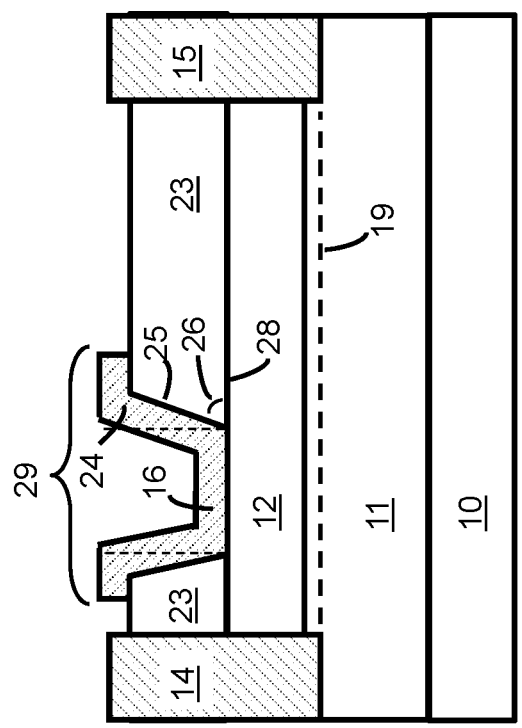
Figure 4:
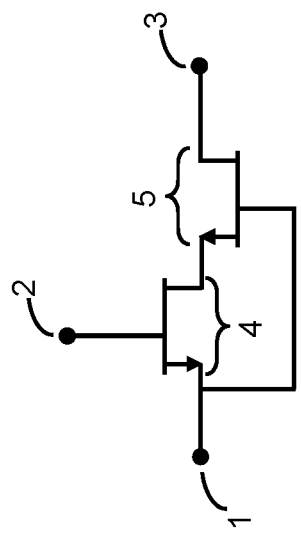
FIG. 4 is a circuit representation of a prior art hybrid enhancement-mode device.

Devices based on III-N heterostructures are described. The III-N devices are designed to operate as enhancement-mode transistor devices. The III-N devices described herein can be high-voltage devices suitable for high voltage applications. In such a high-voltage device, when the device is biased off (i.e., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, or higher. When the high voltage device is biased on (i.e., the voltage on the gate relative to the source is greater than the device threshold voltage), it is able to conduct substantial current with a low on-voltage. The maximum allowable on-voltage is the maximum voltage that can be sustained in the application in which the device is used.

Implementations of the device described herein are illustrated in FIGS. 5-23. FIG. 5A is a cross-sectional view of the device, and FIG. 5B is a circuit schematic diagram of the device of FIG. 5A. Referring to FIGS. 5A and 5B, a hybrid enhancement-mode electronic device 40 is formed of a III-Nitride low-voltage enhancement-mode transistor 41 and a III-Nitride high-voltage depletion-mode transistor 42. Transistors 41 and 42 are formed on a common set of III-Nitride layers 11 and 12, such that the entire hybrid device 40 is integrated onto a single chip. As shown in FIG. 5A, both devices 41 and 42 include a device channel 19 which is in the common set of III-N material layers 11 and 12. The hybrid device 40 further includes a substrate 10 (although the substrate is optional), which can for example be silicon, GaN, silicon carbide, AlN, or sapphire, as well as a first III-N layer 11 on top of the substrate, and a second III-N layer 12 on top of the first III-N layer. III-N layers 11 and 12 have different compositions from one another, the compositions selected such that a two-dimensional electron gas (2DEG) 19 (illustrated by a dashed line), i.e., a conductive channel, is induced in the first III-N layer 11 near the interface between the first and second III-N layers 11 and 12, respectively. The hybrid device 40 further includes an insulator layer 22, such as SiN, on the second III-N layer 12. Insulator layer 22 can serve as a passivation layer for the III-Nitride material layers 11 and 12, as well as serving as a gate insulator layer for depletion-mode transistor 42, as further described below.

Enhancement-mode transistor 41 additionally includes source and drain contacts 34 and 35, respectively, which form ohmic contacts to the 2DEG 19, and a gate contact 38 formed on a gate insulator 37. The gate of the enhancement-mode transistor 41 is formed as follows. After depositing insulator layer 22 over III-N layer 12, a recess is etched through insulator layer 22 and into the III-N materials in the gate region 61 of the enhancement-mode transistor 41. As shown in FIG. 5A, the recess can extend through the 2DEG channel 19. Alternatively, the recess may extend partially through III-N layer 12 without extending into III-N layer 11, such that the recess does not extend all the way through the 2DEG channel 19 (not shown). The recess is sufficiently deep to ensure that the gate region 61 of enhancement-mode transistor 41 is not conductive when 0V is applied to the gate contact 38 relative to the source contact 34, but is readily conductive when a sufficiently positive voltage is applied to the gate contact 38 relative to the source contact 34. Although the sidewalls of the recess are shown to be substantially vertical, they could alternatively be formed as slanted sidewalls (not shown).

A gate insulator 37 is then conformally deposited in the gate region 61 and over the entire upper surface of insulator layer 22. Gate insulator 37 can, for example, be formed of or include aluminum oxide, silicon dioxide, or another wide bandgap insulator. Next, the gate contact 38 is deposited conformally over gate insulator 37 in the recess in gate region 61. The gate contact 38 includes extending portions 31 and 32 that extend towards the source 34 and drain 35 contacts, respectively. The extending portions 31 and 32 are in the source and drain access regions 62 and 63, respectively, of the enhancement-mode transistor 41, and are over the upper surface of both gate insulator 37 and insulator layer 22. Extending portion 32 functions as a field plate for the enhancement-mode transistor 41. In implementations where the sidewalls of the recess in which layers 37 and 38 are deposited are slanted, extending portion 32 functions as a slant field plate, which may improve device performance. Finally, the gate contact 38 is used as an etch mask to etch gate insulator 37, such that gate insulator 37 remains directly beneath gate contact 38 but is etched away everywhere else.

Referring now to the high-voltage depletion-mode transistor 42 of hybrid device 40, depletion-mode transistor 42 includes source and drain contacts 44 and 45, respectively, which form ohmic contacts to the 2DEG 19. Depletion-mode transistor 42 also includes an electrode 49 which is deposited in a recess 17 in an electrode-defining layer 33 which is formed over the III-N material layers 11 and 12. The recess 17 can extend through the entire thickness of the electrode-defining layer 33, as shown in FIG. 5A. Alternatively, the recess 17 may only extend partially through the electrode-defining layer 33 (not shown). The width at the top of the recess 17 is greater than the width at the bottom of the recess 17. The electrode 49 is deposited conformally in the recess 17 in the electrode-defining layer 33 with extending portions 46 and 47 over sidewalls of the recess. Hence, the profiles of the extending portions are at least partially determined by the profiles of the corresponding sidewalls.

The electrode-defining layer 33 is typically between about 0.1 microns and 5 microns thick, such as about 0.85 microns thick. The electrode-defining layer 33 can have a composition that is substantially uniform throughout. The electrode-defining layer 33 is formed of an insulator, such as silicon nitride ($SiN_x$).

As described above, electrode 49 is formed in the recess 17. In the implementation shown in FIG. 5A, the electrode 49 conformally covers the entire exposed surface in the recess, although in some implementations the electrode 49 only covers a portion of the exposed surface in the recess (not shown), as further described below. The portion of electrode 49 in gate region 51 is the gate 48 of the device. Electrode 49 further includes a first extending portion 47, which is over a portion of the electrode-defining layer 33 in the drain access region 53, and a second extending portion 46, which is over a portion of the electrode-defining layer 33 in the source access region 52. The first extending portion 47 functions as a field plate, reducing the peak electric field in the depletion-mode transistor 42 when the hybrid device 40 is biased in the OFF state (i.e., with the voltage of gate node 2 relative to source node 1 lower than the device threshold voltage) with a large drain-source voltage. The second extending portion 46 is included to ensure that the electrode 49 extends towards the source contact 44 at least beyond the source-side edge of the gate region 51 in case of misalignment of the gate electrode 49 to the recess during device fabrication. Although the second extending portion 46 is shown to extend all the way over the source-side sidewall of the recess 17, in some implementation, it may only extend partially up the sidewall (not shown). Having the second extending portion 46 extend partially up the sidewall may reduce capacitances in the device, thereby improving device performance.

Source and drain contacts 44 and 45, respectively, are on opposite sides of the gate 48. The depletion-mode transistor 42 also includes a gate region 51, in which the gate 48 is deposited, and source and drain access regions 52 and 53, respectively, on opposite sides of the gate region. The regions 56 of the device structure in which the source and drain contacts 44 and 45, respectively, are deposited are referred to as the device ohmic regions. The source access region 52 is between the source contact 44 and gate 48, and the drain access region 53 is between the drain contact 45 and gate 48.

The depletion-mode transistor 42 optionally includes an additional dielectric layer 21 between the electrode-defining layer 33 and the insulator layer 22. The additional dielectric layer 21, which can be formed of an insulator such as AlN, can serve as an etch stop layer during the formation of the recess 17, as further described below. As seen in FIG. 5A, the recess 17 may optionally extend through the entire thickness of the electrode-defining layer 33 and through the entire thickness of the additional dielectric layer 21. Gate 48 can then be formed on the insulator layer 22, such that insulator layer 22 is between the III-N materials and gate 48, such that insulator layer 22 serves as a gate insulator for the depletion-mode transistor 42. A gate insulator can help prevent gate leakage currents in the depletion-mode transistor 42. As also illustrated in FIG. 5A, the additional dielectric layer 21 and electrode-defining layer 33 may additionally be formed on or included in the enhancement-mode transistor 41.

In order for hybrid device 40 to operate as a high-voltage enhancement-mode device, transistors 41 and 42 are connected in the circuit configuration shown in FIG. 5B. That is, the source contact 44 of the depletion-mode transistor 42 is electrically connected to the drain contact 35 of the enhancement-mode transistor 41, and the gate 48 of the depletion-mode transistor 42 is electrically connected to the source contact 34 of the enhancement-mode transistor 41. As seen in FIG. 5A, such a configuration can be achieved by connecting contacts 35 to contact 44 via wire bond 36 and by connecting contact 34 to electrode 49 via wire bond 43. Alternatively, these connections can be formed in other ways, for example by running metal trace lines from contact 35 to contact 44 and from contact 34 to electrode 49.

In some implementations, in order to provide stability to the device and/or to improve reliability, a current-carrying component 39 (shown in FIG. 5A but not in FIG. 5B) can be connected between the source and drain contacts 34 and 35, respectively, of the enhancement-mode transistor 41. For example, if the device is to be used in applications where current flows through the device in both directions, for example as a switch in a bridge circuit, the enhancement-mode transistor 41 may be unstable in reverse conduction mode. In this case, stabilizing the device can be achieved by having current-carrying component 39 be a diode, where the anode of the diode is connected to source contact 34, and the cathode of the diode is connected to drain contact 35. When the device of FIG. 5A is operated in the off state with a positive voltage applied to drain contact 45 relative to source contact 34, the diode is reverse biased and blocks about the same voltage as enhancement-mode transistor 41. Hence, the diode does not need to be a high-voltage component. As such, hybrid device 40 can have a breakdown voltage that is at least 2 times or at least 3 times or at least 10 times that of the diode.

Alternatively, current-carrying component 39 could be included to allow off-state leakage currents in the enhancement-mode transistor 41 to be better matched to off-state leakage currents in the depletion-mode transistor 42. In this case, current-carrying component 39 can be a resistor, or a diode with an anode connected to drain contact 35 and a cathode connected to source contact 34. Or, current-carrying component 39 can be a combination of transistors and diodes, connected in parallel, series, or a combination of parallel and series connections.

Still referring to FIG. 5A, the separation between the extending portion 32 of the gate contact 38 of enhancement-mode transistor 41 and the device channel 19 is indicated by arrow 6, and the separation between the gate 48 of the depletion-mode transistor 42 and the device channel 19 is indicated by arrow 7. As illustrated, the separation indicated by arrow 6 can be made larger than the separation indicated by arrow 7. This relationship can also be maintained in all other device implementations described below. As compared to similar devices in which recess 17 does not extend as deep, such that the separation indicated by arrow 6 is smaller than the separation indicated by arrow 7, it has been found that the breakdown voltage of the device in FIG. 5A is increased and device stability is improved substantially, in particular during high voltage operation of the device. This result was unexpected. It is speculated that having gate 48 closer than extending portion 32 to the device channel 19 causes a larger percentage of the total voltage applied across hybrid device 40 to be supported by electric fields beneath extending portion 47 instead of by electric fields beneath or near extending portion 32. Stated differently, having gate 48 closer than extending portion 32 to the device channel 19 can cause the peak electric field in the device to be beneath or near extending portion 47 rather than beneath or near extending portion 32. This has the effect of reducing the ratio of voltage supported by the enhancement-mode transistor 41 to voltage supported by the depletion-mode transistor 42. Because depletion-mode transistor 42 is better equipped than enhancement-mode transistor 41 to support large voltages, such a configuration, along with the corresponding reduction in voltage across the enhancement-mode transistor 41, may provide more stability to the enhancement-mode transistor 41. Alternatively, a similar improvement in device stability could be achieved by utilizing insulating materials between portion 48 of electrode 49 and 2DEG 19 that have a larger average dielectric constant than that of the material between extending portion 32 and 2DEG 19. Specifically, if the separation indicated by arrow 6 divided by the average dielectric constant of the material directly between extending portion 32 and 2DEG 19 is greater than the separation indicated by arrow 6 divided by the average dielectric constant of the material directly between portion 48 and 2DEG 19, then a larger percentage of the total voltage applied across hybrid device 40 would be supported by electric fields beneath extending portion 47 instead of by electric fields beneath or near extending portion 32, and a similar improvement in device stability occurs.

As used herein, two or more contacts or other items such as conductive layers or components are said to be "electrically connected" if they are connected by a material which is sufficiently conducting to ensure that the electric potential at each of the contacts or other items is intended to be the same, i.e., is about the same, at all times under any bias conditions. As used herein, a "hybrid enhancement-mode electronic device or component" is an electronic device or component formed of a high-voltage depletion-mode transistor and a low-voltage enhancement-mode transistor configured such that the component can operate similarly to a single high-voltage enhancement-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage applied to the third node (drain node) relative to the source node. When the gate node is held at a sufficiently positive voltage relative to the source node, current passes from the source node to the drain node or from the drain node to the source node when a sufficiently positive voltage is applied to the source node relative to the drain node or to the drain node relative to the source node, respectively. As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications.

As used herein, a "high-voltage device", such as a high-voltage switching transistor, is an electronic device which is optimized for high-voltage switching applications. That is, when the transistor is off, it is capable of blocking high voltages, such as about 300V or higher, about 600V or higher, or about 1200V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, or other suitable blocking voltage required by the application. In some implementations, a high-voltage device can block any voltage between 0V and at least $2*V_{max}$. As used herein, a "low-voltage device", such as a low-voltage transistor, is an electronic device which is capable of blocking low voltages, such as between 0V and $V_{low}$ (where $V_{low}$ is less than $V_{max}$), but is not capable of blocking voltages higher than $V_{low}$. In some implementations, $V_{low}$ is equal to about $|V_{th}|$, about $2*|V_{th}|$, about $3*|V_{th}|$, or between about $|V_{th}|$ and $3*|V_{th}|$, where $|V_{th}|$ is the absolute value of the threshold voltage of a high-voltage transistor contained within the circuit in which the low-voltage device is used. In other implementations, $V_{low}$ is about 10V, about 20V, about 30V, about 40V, or between about 5V and 50V, such as between about 10V and 30V. In yet other implementations, $V_{low}$ is less than about $0.5*V_{max}$, less than about $0.3*V_{max}$, less than about $0.1*V_{max}$, less than about $0.05*V_{max}$, or less than about $0.02*V_{max}$. In implementations described herein, high-voltage transistors which are connected or coupled to a low-voltage transistor can have breakdown voltages which are at least 3 times, at least 5 times, or at least 10 times the breakdown voltage of the low-voltage transistor.

Dispersion refers to a difference in observed current-voltage (I-V) characteristics when the device is operated under RF or switching conditions, as compared to when the device is operated under DC conditions. In III-N devices, effects such as dispersion are often caused by voltage fluctuations at the uppermost surface(s) of the III-N material layers, the result of charging of surface states during device operation. Accordingly, an insulating layer such as layer 22 in FIG. 5A can serve as a passivation layer, preventing or suppressing dispersion by preventing or suppressing voltage fluctuations at the uppermost III-N surface. In implementations where additional dielectric layer 21 is included between insulator layer 22 and electrode-defining layer 33, the combination of insulator layer 22, additional dielectric layer 21, and electrode-defining layer 33 maintain effective passivation of the uppermost III-N surface. In some cases, for example when the additional dielectric layer 21 is AlN, the layer 21 may need to be made thin enough, such as thinner than about 20 nm, thinner than about 10 nm, or thinner than about 5 nm, to ensure that effective passivation of the uppermost III-N surface is still maintained. Too thick an additional dielectric layer 21, such as greater than about 20 nm, can degrade the passivation effects of layers 22 and 33.

Figure 6:
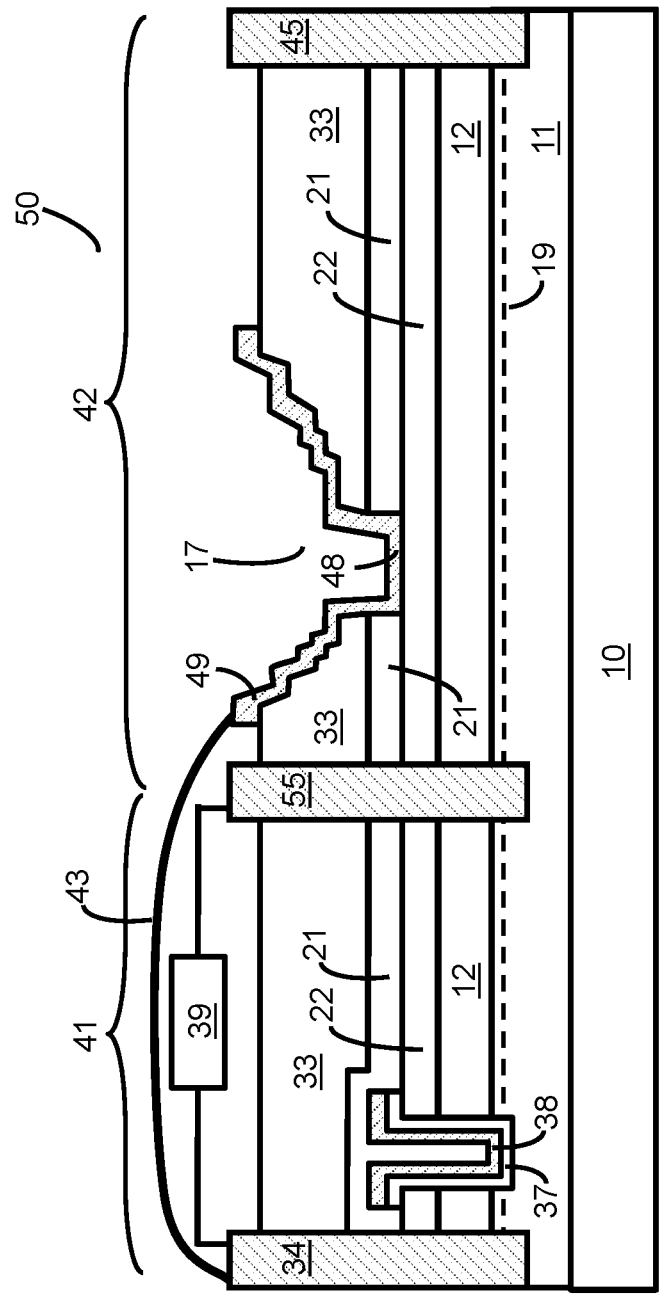
FIGS. 6-8 are cross-sectional views of other implementations of III-N devices.

Referring again to FIG. 5A, because the drain contact 35 of the enhancement-mode transistor 41 is adjacent to the source contact 44 of the depletion-mode transistor 42, and the two contacts are electrically connected, the drain and source contacts 35 and 44, respectively, may be combined into a single contact 55. Such a configuration is shown in FIG. 6. Device 50 of FIG. 6 is the same as that in FIG. 5A, except that the drain and source contacts of transistors 41 and 42, respectively, have been combined into a single contact 55 (for clarity, some of the reference numerals from FIG. 5A are not shown in FIG. 6). In device 50 of FIG. 6, current-carrying component 39, when included, is connected to source contact 34 and contact 55 as shown. As compared to the device of FIG. 5A, the configuration shown in FIG. 6 can reduce the footprint of the device, thereby reducing costs, and can also simplify the fabrication process.

Figure 7:
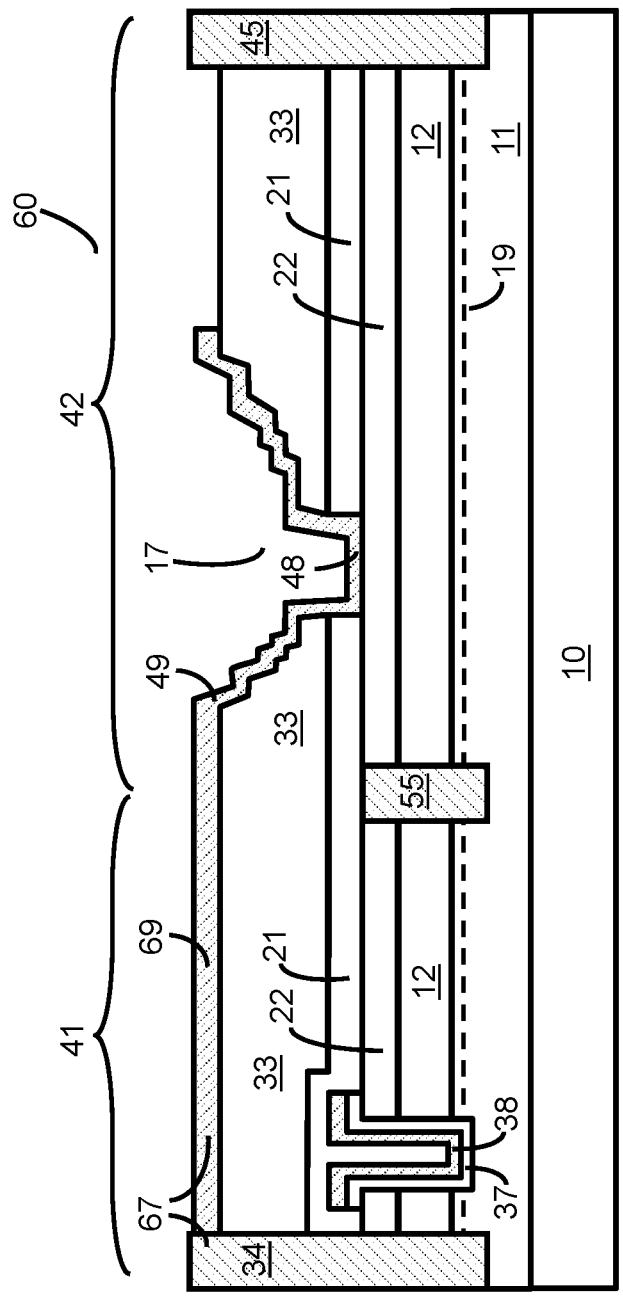

Referring now to FIGS. 5A and 6, because source contact 34 of the enhancement-mode transistor 41 is electrically connected to electrode 49 of the depletion-mode transistor 42 (by connection 43), source contact 34 and electrode 49 may be combined into a single electrode. Such a configuration is shown in FIG. 7. Device 60 of FIG. 7 is the same as device 50 of FIG. 6, except that the electrode-defining layer 33 (and optionally dielectric layer 21) is formed over contact 55. Furthermore, electrode 49 is extended to include portion 69, which extends all the way to and contacts source contact 34. Thus, source contact 34 and electrode 49 are provided as a single electrode 67. Although not shown in FIG. 7, a current-carrying component 39, such as that shown in FIGS. 5A and 6 and described previously, can also be between contacts 34 and 55, with one end of the current-carrying component electrically connected to contact 34 and the other end electrically connected to contact 55. Because contact 55 is beneath the single electrode 67, in order to access contact 55 so that a current-carrying component can be connected to it, the device 60 can include a region in which portion 69 is not included and the layers above contact 55 (i.e., layers 33 and 21) are removed. The gate 38 of the enhancement-mode transistor 41 may be similarly accessed.

For the devices of FIGS. 5-7, in implementations where current-carrying component 39 is not utilized, the contacts that form the drain of enhancement-mode transistor 41 and the source of depletion-mode transistor 42 (contacts 35 and 44 in FIG. 5A and contact 55 in FIGS. 5-6) are not used for any functional purpose during device operation. Hence, these contacts can be omitted. Consequently, in devices 40, 50, and 60 from FIGS. 5A, 6, and 7, respectively, the III-N enhancement-mode transistor 41 can lack a drain contact and the III-N depletion-mode transistor 42 can lack a source contact, in which case the III-N enhancement-mode transistor 41 and III-N depletion-mode transistor 42 share a common drift region between the gate contact 38 and gate 48.

Figure 8:
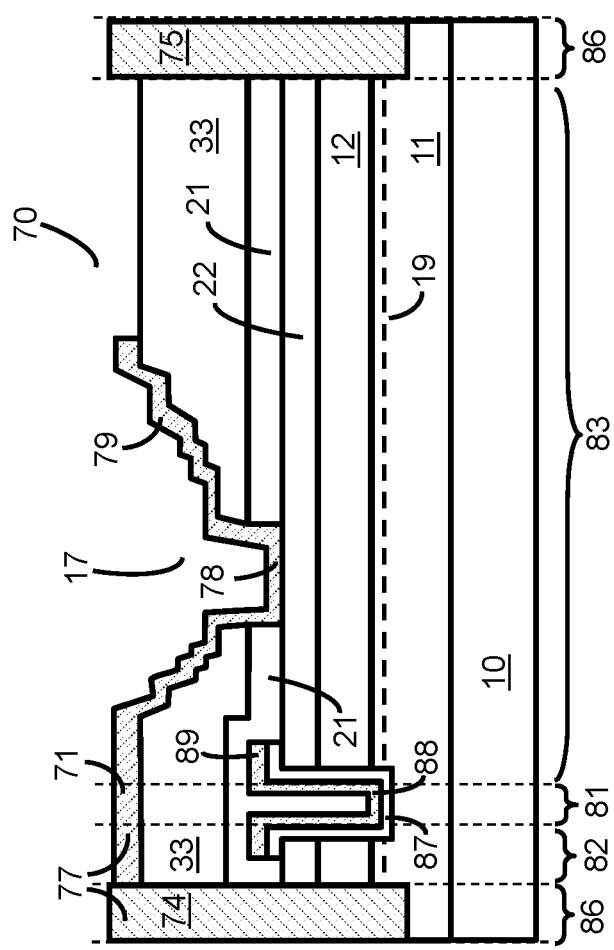

FIG. 8 shows a cross-sectional view of another implementation of a III-Nitride device 70. Device 70 is a single enhancement-mode III-Nitride transistor. Electrode 77 of device 70 includes both the source contact 74 and a source-connected field plate 79. Similar to the gate electrode of the depletion-mode transistor in the implementations of FIGS. 5A, 6, and 7, field plate 79 is at least partially in a recess 17 formed in electrode-defining layer 33. Also similar to the implementations of FIGS. 5A, 6, and 7, device 70 additionally includes a substrate 10 (although the substrate is optional), a III-Nitride material structure including III-N layers 11 and 12 on the substrate 10, a 2DEG channel 19 in the III-Nitride material structure, an insulator layer 22 on the III-Nitride material structure, an additional dielectric layer 21 on the insulator layer 22, and an electrode-defining layer 33 on the additional dielectric layer 21. In some implementations, additional dielectric layer 21 and insulator layer 22 are optional and may be omitted (not shown). Device 70 also includes a drain contact 75, as well as a gate 88 formed on a gate insulator 87. Region 81, in which the gate 88 is deposited, is referred to as the gate region of the device. Regions 86, in which the source contact 74 and drain contact 75 are deposited, are referred to as the contact regions. Region 82, between the source contact region and the gate region, is referred to as the source access region. Region 83, between the drain contact region and the gate region, is referred to as the drain access region.

As in previous implementations, a recess is formed through the insulator layer 22 and optionally into the III-N material structure in the gate region 81 where gate 88 is formed, and gate insulator 87 and gate 88 are deposited in the recess. As seen in FIG. 8, the recess containing gate insulator 87 and gate 88 can be formed through the 2DEG channel 19. The recess can be formed at least deep enough that when 0V is applied to the gate 88 relative to the source contact 74, the device channel in the gate region 81 is depleted of charge, and the device is in the OFF state, but the device channel in the gate region becomes readily conductive when a sufficiently positive voltage is applied to the gate 88 relative to the source contact 74.

Similar to the case described for device 40 in FIG. 5A, in device 70 of FIG. 8, the extending portion 89 of the gate 88, which is over the upper surface of the III-N material structure (layers 11 and 12) and functions as a gate-connected field plate, can have a larger separation from the 2DEG channel 19 than the portion 78 of the source-connected field plate 79 which is at the bottom of the recess 17. Alternatively, the relationship between portion separation from the 2DEG 19 and average dielectric constant of the intermediary materials previously described with reference to device 40 of FIG. 5A may also be maintained in device 70.

The same may also be true for devices 80, 90, 90', and 90", which are illustrated in FIGS. 9A-9C, 10A-10B, 10C, and 10D, respectively, and are described in further detail below. As compared to similar devices in which recess 17 does not extend as deep, therefore resulting in a source-connected field plate which is everywhere further from the channel than the gate-connected field plate, or for which the ratio referenced above is not met, it has been found that the breakdown voltage of the device 70 in FIG. 8 is increased and device stability is improved substantially, in particular during high voltage operation of the device. This result was unexpected. It has been shown that in device 70, having portion 78 of field plate 79 closer than extending portion 89 to the device channel 19 causes a larger percentage of the total voltage applied across device 70 to be supported by electric fields beneath or near field plate 79 instead of by electric fields beneath or near extending portion 89. Stated differently, having portion 78 of field plate 79 closer than extending portion 89 to the device channel 19 can cause the peak electric field in the device to be beneath or near field plate 79 rather than beneath or near extending portion 89. The region beneath field plate 79 is better equipped to support large voltages with smaller peak electric fields than the region beneath or near the gate 88. Hence, such a configuration may provide more stability to device 70.

In the device 70 of FIG. 8, the source-connected field plate 79 is shown to run directly over the gate 88. That is, portion 71 of field plate 79 is directly over the gate 88 and is at least partially in the gate region 81 of the device. Although portion 71 could be over the gate 88 across the entire width of the gate, such a configuration could result in a large gate-to-source capacitance, which can degrade the device performance. Instead, portion 71 could be designed to only be over the gate over a portion of the gate width $W_{gate}$.

Figure 9A:
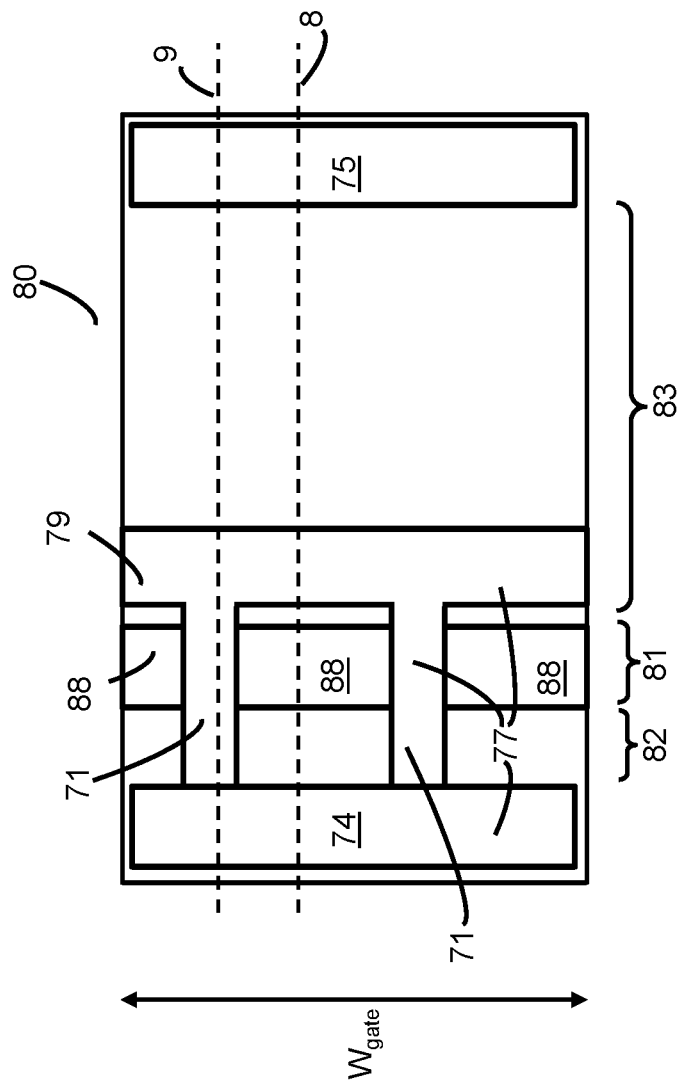
FIG. 9A is a plan view of yet another implementation of a III-N device.
Figure 9B:
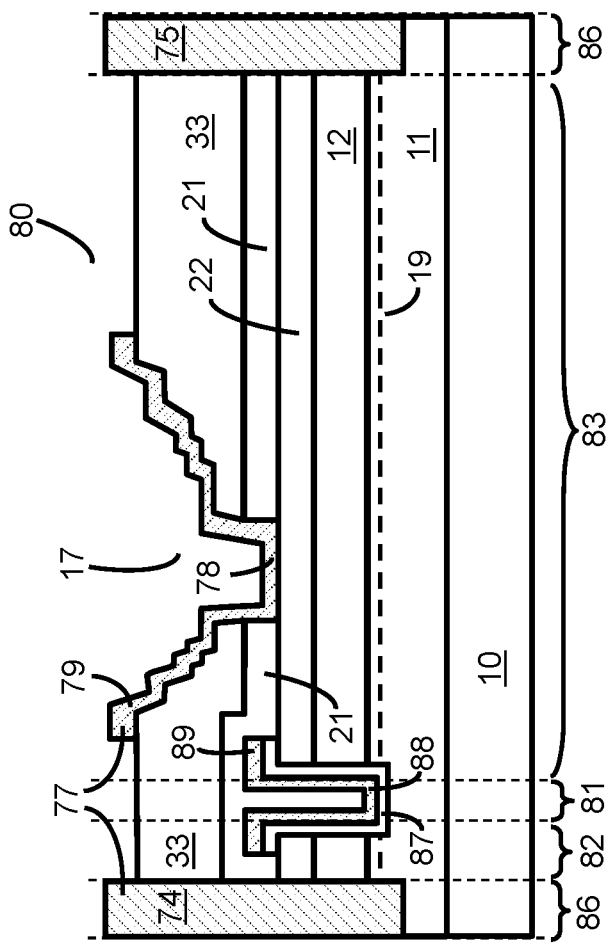
FIG. 9B is a cross-sectional view along dashed line 8 of the III-N device of FIG. 9A.
Figure 9C:
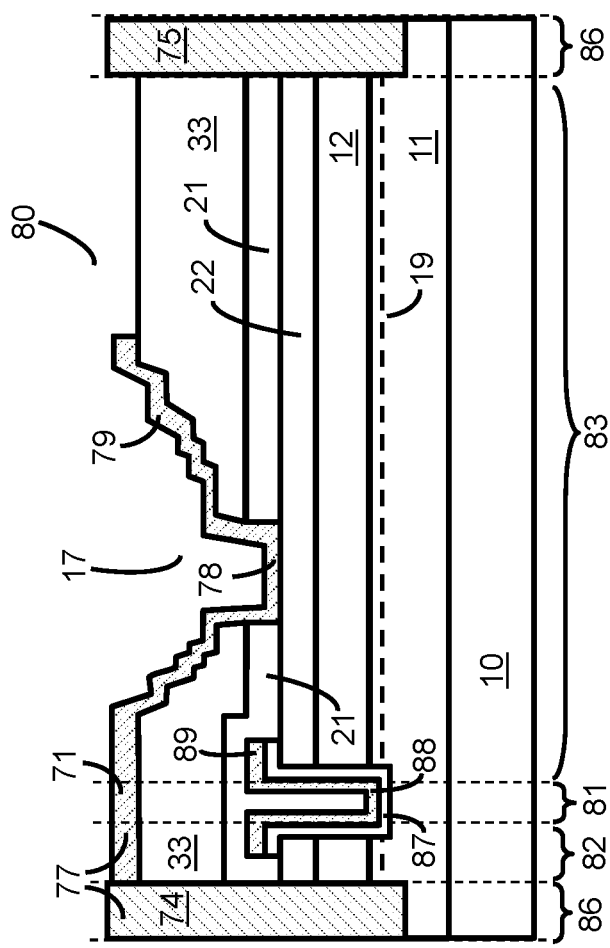
FIG. 9C is a cross-sectional view along dashed line 9 of the III-N device of FIG. 9A.

Such a configuration is shown in device 80 of FIGS. 9A-9C, where FIG. 9A is a plan view (top view) of device 80, FIG. 9B is a cross-sectional view along dashed line 8 in FIG. 9A, and FIG. 9C is a cross-sectional view along dashed line 9 in FIG. 9A. As seen in FIG. 9A, portion 71 is formed of a plurality of strips, each of which passes over the gate 88 and connects source contact 74 to the remainder of electrode 79. However, in between each of the strips 71, material of electrode 77 is not included. As seen in FIG. 9C, electrode-defining layer 33 is between the strips 71 and gate 88, thereby allowing the strips 71 to run over the gate 88 without short-circuiting the gate 88 to the source contact 74. In some implementations, field plate 79 is directly over half the width of the gate or less.

For each of devices 70 and 80 in FIGS. 8 and 9, respectively, if the device is to be used in applications where current flows through the device in both directions, for example as a switch in a bridge circuit, the device may become unstable in reverse conduction mode (when the drain is at a lower voltage than the source and current flows through the device). In this case, stabilizing the device can be achieved by connecting a diode anti-parallel to the device (not shown), where the anode of the diode is connected to source contact 74, and the drain of the diode is connected to drain contact 75. For such a configuration, when device 70 or 80 is operated in reverse conduction mode with the gate biased below the device threshold voltage relative to the source, the reverse current flows through the diode rather than through the channel of the device. In this configuration, the reverse bias breakdown voltage of the diode as well as the breakdown voltage of the device 70 or 80 would need to be greater than the circuit high voltage.

Figure 10A:
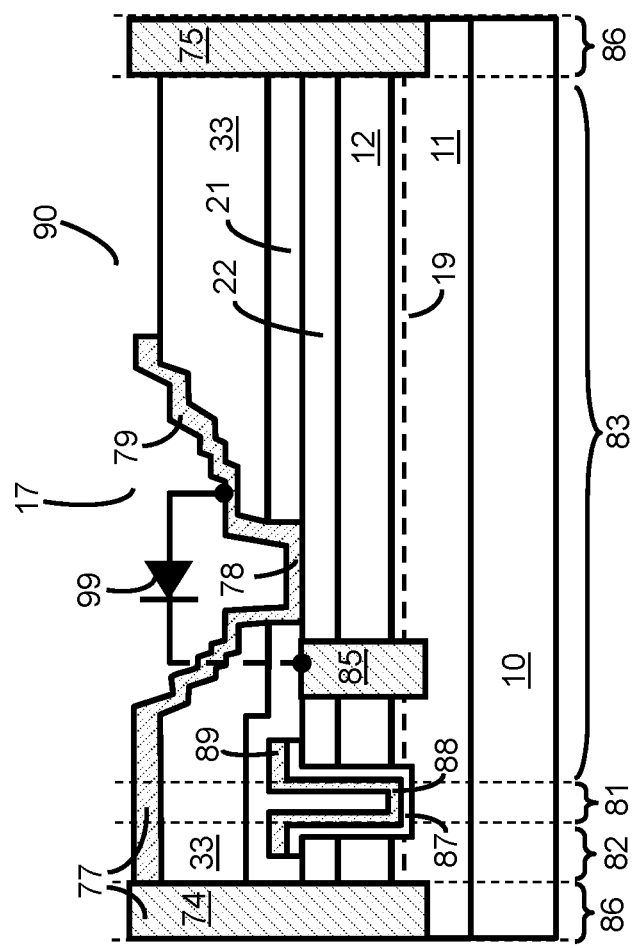
FIGS. 10A and 10B are cross-sectional and plan views, respectively, of still another implementation of a III-N device.
Figure 10B:
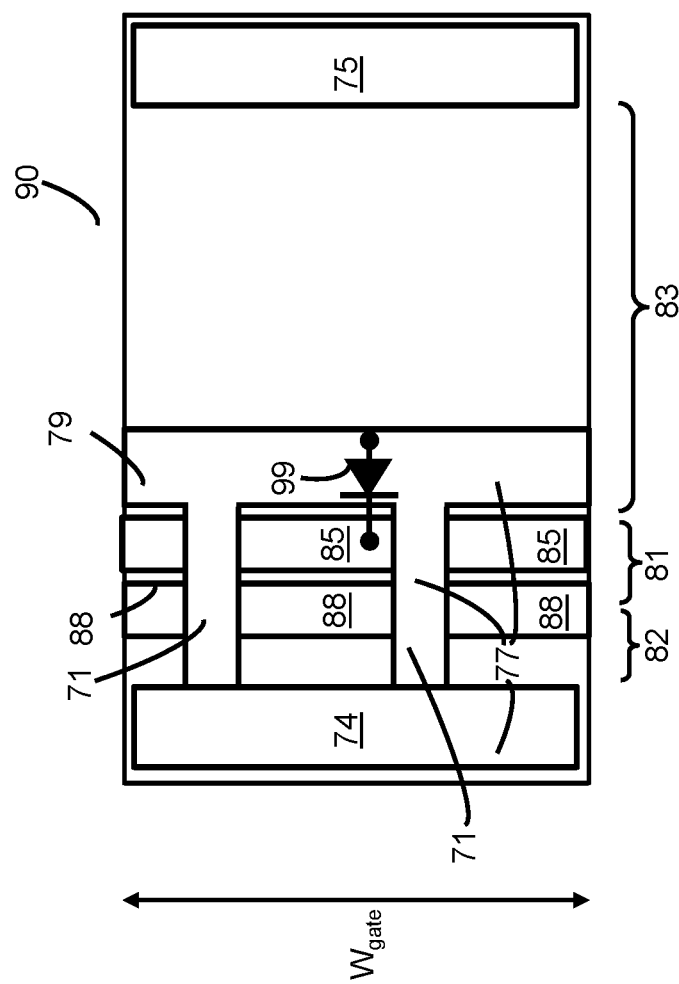

FIGS. 10A and 10B show an alternative configuration for a device 90 in which a diode 99 having a substantially smaller reverse bias breakdown voltage than that of the device 90 is used to stabilize the device 90 during reverse conduction. FIG. 10A is a cross-sectional view of the device, while FIG. 10B is a plan view (top view). Device 90 of FIGS. 10A and 10B is similar to devices 70 and 80 of FIGS. 8 and 9, respectively, but further includes an electrode 85 contacting the 2DEG 19 between the gate 88 and the drain contact 75. Opposite ends of a diode 99 are connected to the electrode 85 and to electrode 77. As shown, the anode of the diode 99 is electrically connected to electrode 77, and the cathode is electrically connected to electrode 85. As also shown, the anode of diode 99 is electrically connected directly to the source-connected field plate 79 of electrode 77. Alternatively, the anode of diode 99 could be electrically connected directly to source contact 74 (not shown) or to the source bus which is connected to each of the source fingers in the device (not shown).

In the configuration shown in FIGS. 10A and 10B, when the device 90 is in reverse conduction mode, with the drain contact 75 biased at a slightly lower voltage than the source contact 74 and the gate 88 biased below the device threshold voltage relative to the source contact 74, current flows from the source contact 74 into the source-connected field plate 79, then through the diode 99 into electrode 85, and then through 2DEG 19 from electrode 85 to the drain contact 75. If the design of device 90 is modified such that the anode of diode 99 is electrically connected directly to source contact 74 or to the source bus, then in reverse conduction mode, current flows from the source contact 74 or from the source bus directly into the diode 99 without flowing into the source-connected field plate 79. When the device 90 is biased with a large positive voltage on the drain contact 75 relative to the source contact 74 and with the gate 88 below the device threshold voltage relative to the source contact 74, such that the device is blocking the drain-source voltage, most of the drain-source voltage drops between drain contact 75 and electrode 85. Thus the voltage across diode 99 is much smaller than the total drain-source voltage. As such, the reverse bias breakdown voltage of the diode 99 can be much smaller than the breakdown voltage of device 90, which can result in lower switching losses and lower electromagnetic interference (EMI) during switching, as compared to the case where a higher voltage diode is connected across the entire device.

Figure 10C:
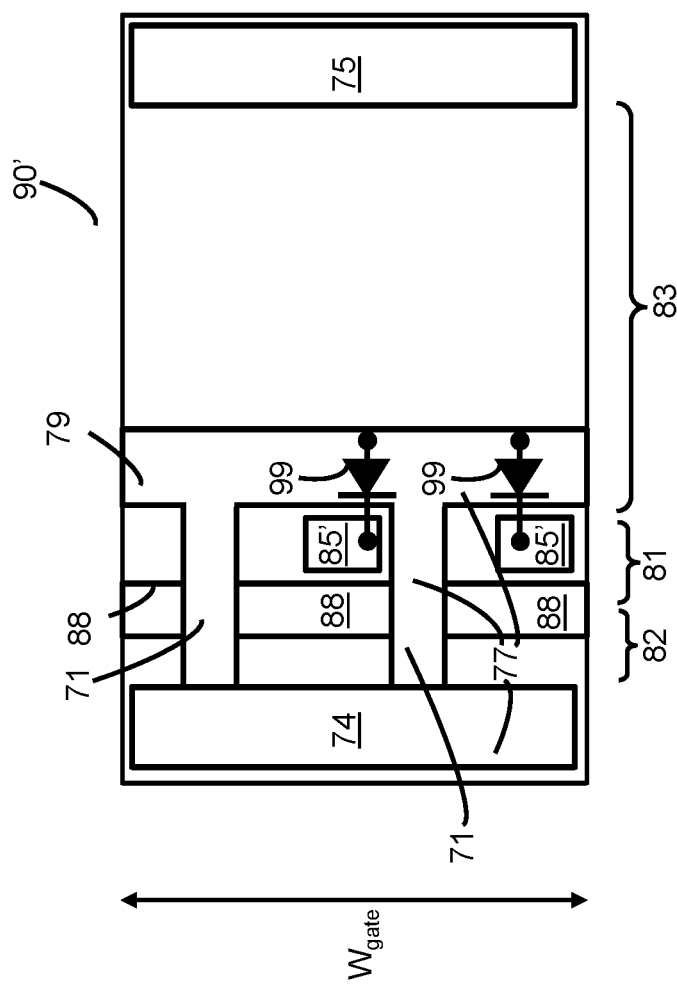
FIG. 10C is a plan view of yet another implementation of a III-N device.

FIG. 10C is a plan view of a device 90' which is similar to device 90 of FIGS. 10A and 10B but includes several modifications. As seen in FIG. 10B, in device 90, electrode 85 extends across the entire width of the device. However, in device 90' of FIG. 10C, electrode 85 is replaced with a plurality of electrodes 85' along the width of the device. The sum of the widths of all of the electrodes 85' is smaller than the gate width $W_{gate}$ of the device 90'. As seen in FIG. 10C, each of the electrodes 85' has a diode 99 connected between electrode 77 and the electrode 85'. Alternatively, a single diode 99 could be connected to one of the electrodes 85', and the electrodes 85' could all be electrically connected to one another (not shown).

FIG. 10D is a cross-sectional view of a device 90" which is similar to device 90 of FIGS. 10A and 10B but includes several modifications. As seen in FIG. 10D, device 90" includes a contact 85' in place of the diode 99 and electrode 85 that were included in device 90. Contact 85' is connected to or is part of field plate 79, and directly contacts the upper surface of the III-N materials, forming a Schottky contact to the III-N materials. Hence, with this configuration, the diode between electrode 77 and the 2DEG 19 is integrated into the device rather than being provided as an external component.

As stated earlier, III-N layers 11 and 12 have different compositions from one another. The compositions are selected such that the second III-N layer 12 has a larger bandgap than the first III-N layer 11, which helps enable the formation of 2DEG 19. As an example, III-N layer 11 can be GaN and III-N layer 12 can be AlGaN or AlInGaN, whereas layer 12 can be n-doped or can contain no significant concentration of doping impurities. In the case that layer 12 is undoped, the induced 2DEG results from the difference in polarization fields between layers 11 and 12.

Substrate 10 can be any suitable substrate upon which III-N layers 11 and 12 can be formed, for example silicon carbide (SiC), silicon, sapphire, GaN, AlN, or any other suitable substrate upon which III-N devices can be formed. In some implementations, a III-N buffer layer (not shown) such as AlGaN or AlN is included between substrate 10 and semiconductor layer 11 to minimize material defects in layers 11 and 12.

Figure 11:
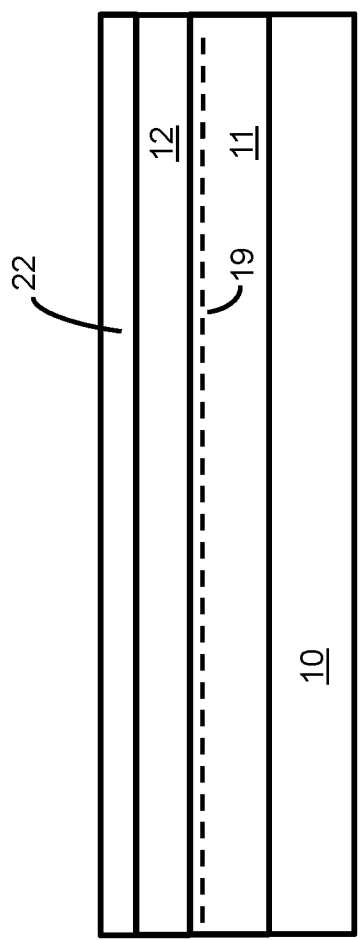
FIGS. 11-20 illustrate a method of fabricating the III-N device of FIG. 8.
Figure 12:
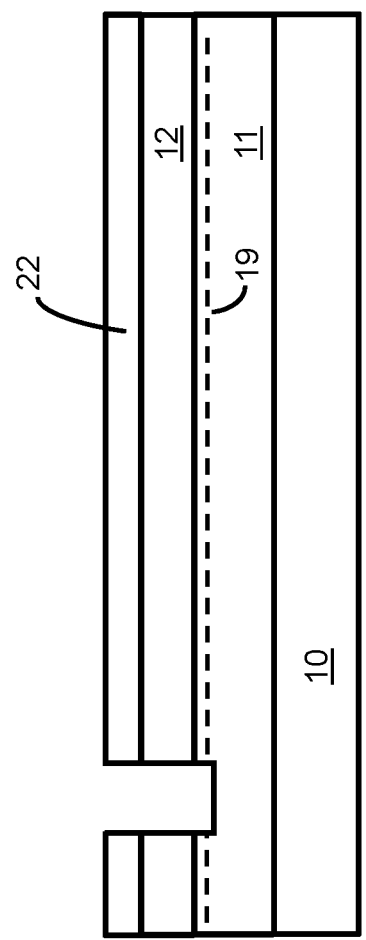

A method of forming the device of FIG. 8 is illustrated in FIGS. 11-20. The same method can be used to form the implementations illustrated in FIGS. 5-7, 9-10, and 21-24, provided that additional steps for adding additional features included in these implementations are also performed. Referring to FIG. 11, III-N material layers 11 and 12 are formed on substrate 10, for example by metalorganic chemical vapor deposition (MOCVD) or molecular beam epitaxy (MBE). Insulator layer 22, formed over the III-N material layers 11 and 12, is then deposited by methods such as MOCVD, plasma enhanced chemical vapor deposition (PECVD), or low pressure chemical vapor deposition (LPCVD). Next, as seen in FIG. 12, a recess is formed in the gate region of the device. The recess, which can be formed using conventional lithographical and etching techniques, is achieved by etching through the insulator layer 22, and optionally into the III-N material layers. The recess may optionally extend through the 2DEG channel 19 in the III-N material layers.

Figure 13:
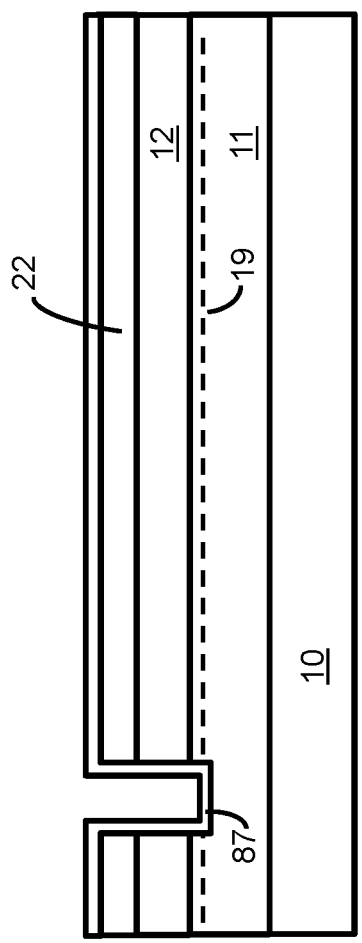
Figure 14:
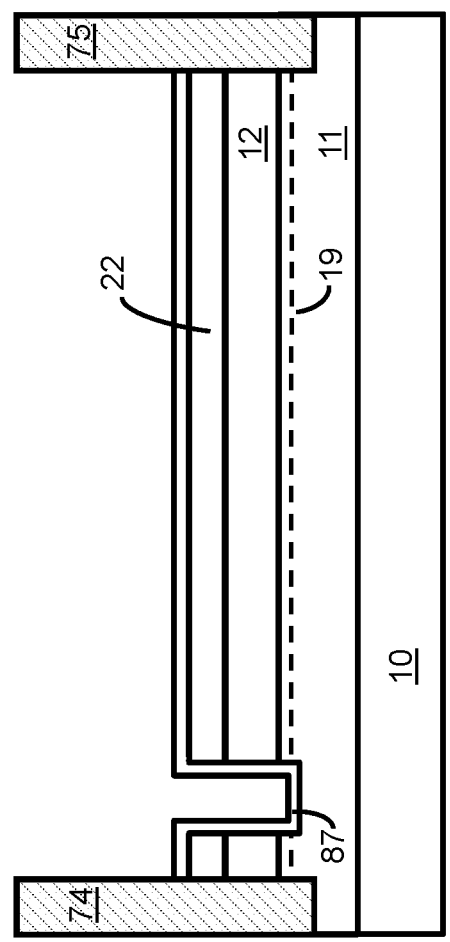

Referring to FIG. 13, a gate insulator layer 87, which for example may be formed of or include aluminum oxide, silicon dioxide, silicon nitride, hafnium oxide, and/or another wide bandgap insulator, is then deposited conformally in the recess and over the upper surface of the device. Next, as seen in FIG. 14, source and drain contacts 74 and 75, respectively, are formed. The source and drain contacts are in electrical contact with the 2DEG 19 induced in the III-N material layers. Source and drain contacts 74 and 75, respectively, can be formed in a number of ways. For example, a metal or combination of metals can be deposited, for example by evaporation, sputtering, or CVD, in ohmic contact regions 86 (shown in FIG. 8) upon the surface of layer 12, followed by a thermal anneal which results in the deposited metal forming a metallic alloy with the underlying semiconductor material. Alternatively, n-type dopants can be ion implanted into ohmic regions 86, followed by a metal deposition by evaporation, sputtering, or CVD, atop this region. Or the material in ohmic contact regions 86 can be etched away, n-type material can be regrown in this region by MOCVD or MBE, and metal can then be deposited atop this region. In an alternative implementation, the source and drain contacts are formed prior to etching the recess in the gate region.

Figure 15:
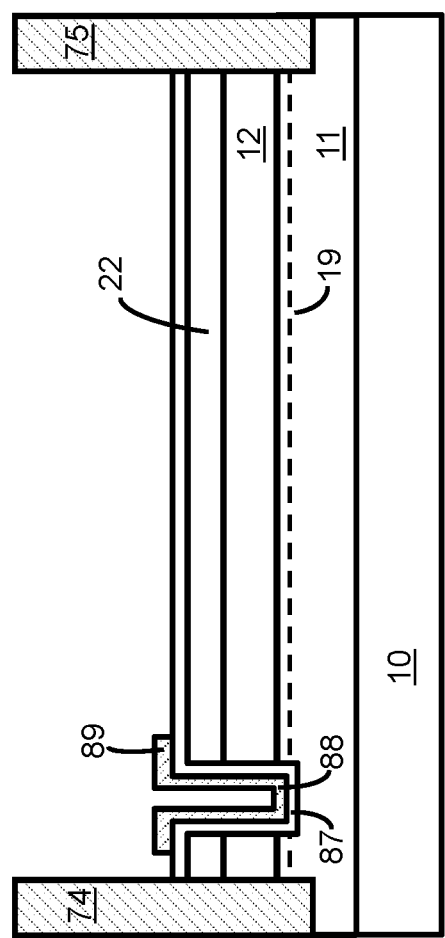
Figure 16:
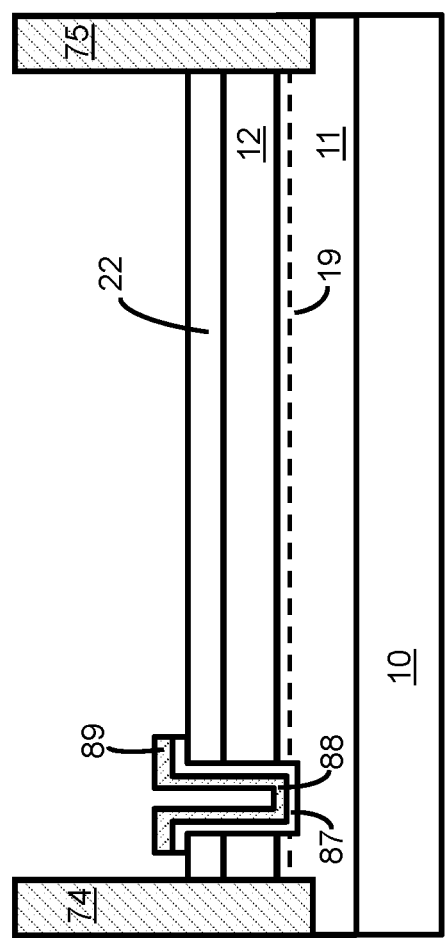

Next, as illustrated in FIG. 15, a gate 88 is deposited conformally on the gate insulator 87 and is at least partially in the gate region 81 (labeled in FIG. 8) of the device. The gate 88 includes a main gate portion which is in the recess, as well as an extending portion 89 that is outside the recess, is over the insulator layer 22 (and also over gate insulator 87), and extends towards the drain contact 75. The extending portion 89 functions as a gate-connected field plate. Referring to FIG. 16, gate insulator 87 is then etched using the gate metal 88 as a mask, resulting in the removal of gate insulator layer 87 everywhere other than directly beneath the gate and beneath extending portion 89. The etch may be performed using an etch chemistry that etches the material of gate insulator layer 87 without substantially etching the material of gate metal 88 or of insulator layer 22.

Figure 17:
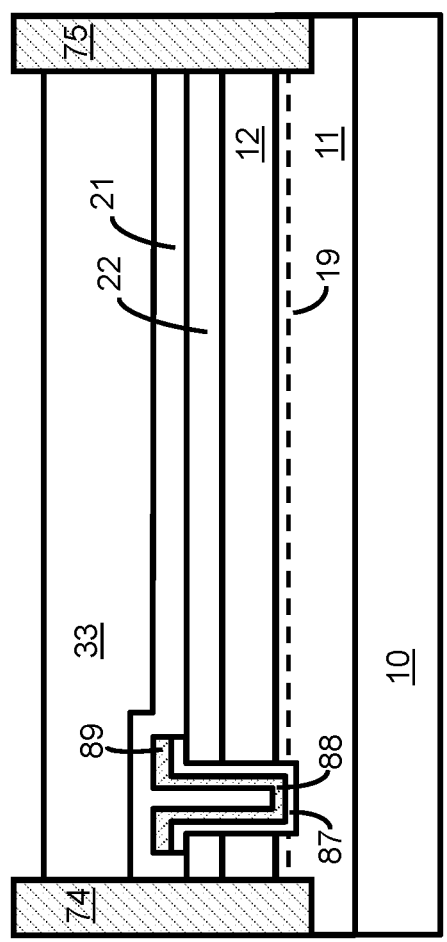
Figure 18:
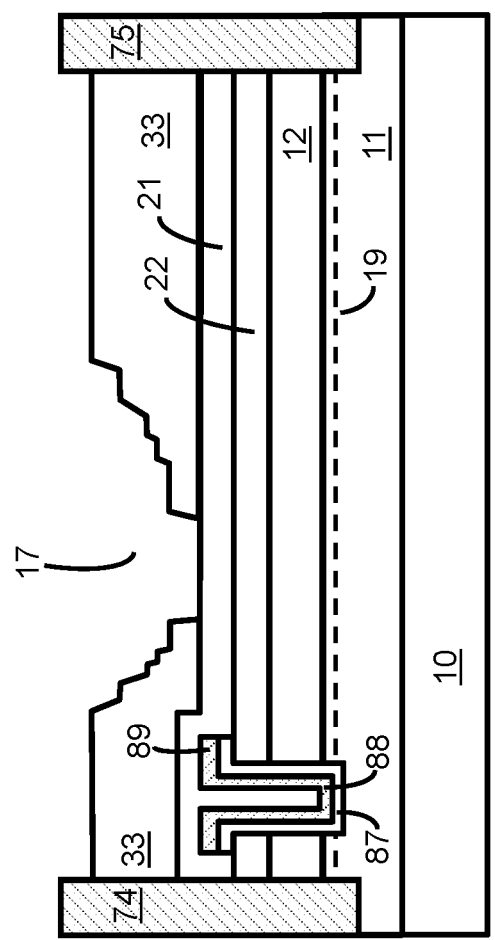

Next, as seen in FIG. 17, the additional dielectric layer 21 and electrode-defining layer 33 are each deposited over insulator layer 22, for example by PECVD, sputtering, or evaporation. A recess 17 is then formed as follows. Referring to FIG. 18, the surface of electrode-defining layer 33 on either side of the recess is covered with a masking material such as photoresist (not shown), and the electrode-defining layer 33 is etched to form recess 17, for example by reactive ion etching RIE or inductively coupled plasma (ICP) etching. Additional dielectric layer 21 can be formed of a material that is not substantially etched by the etch procedure used to etch the recess in the electrode-defining layer 33. In such cases, the additional dielectric layer 21 functions as an etch stop layer, ensuring that the underlying insulator layer 22 is not damaged by the etch.

Figure 19:
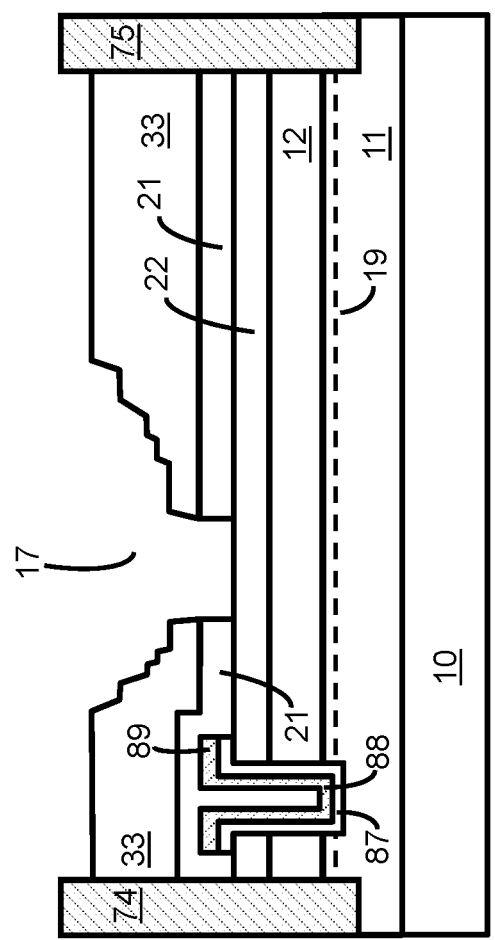

Referring to FIG. 19, after etching the recess 17 through the entire thickness of the electrode-defining layer 33, the portion of the additional dielectric layer 21 which is adjacent to the recess 17 is then removed, for example by performing an etch which etches the material of the additional dielectric layer 21 but does not etch the material of electrode-defining layer 33 or insulator layer 22. For example, when layers 33 and 22 are both $SiN_x$, and layer 21 is AlN, the portion of layer 21 adjacent to the recess 17 in electrode-defining layer 33 can be chemically etched in a base, such as a photoresist developer.

Figure 20:
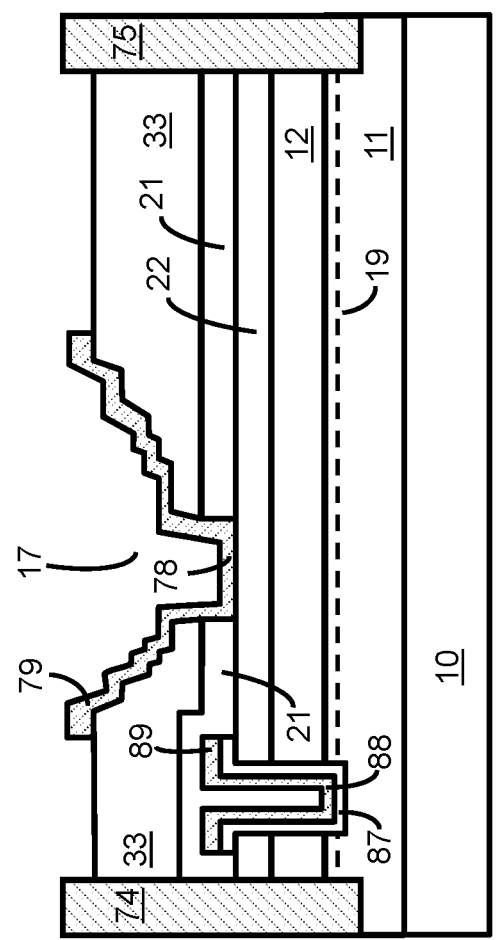

Next, as illustrated in FIG. 20, electrode 79 is deposited conformally in the recess, for example by evaporation, sputtering, or CVD. Finally, portion 71 (shown in FIG. 8) of the field plate which connects the source contact 74 to the remainder of the field plate is formed, resulting in the transistor of FIG. 8. Alternatively, portion 71 may be formed in the same step as electrode 79.

Figure 21A:
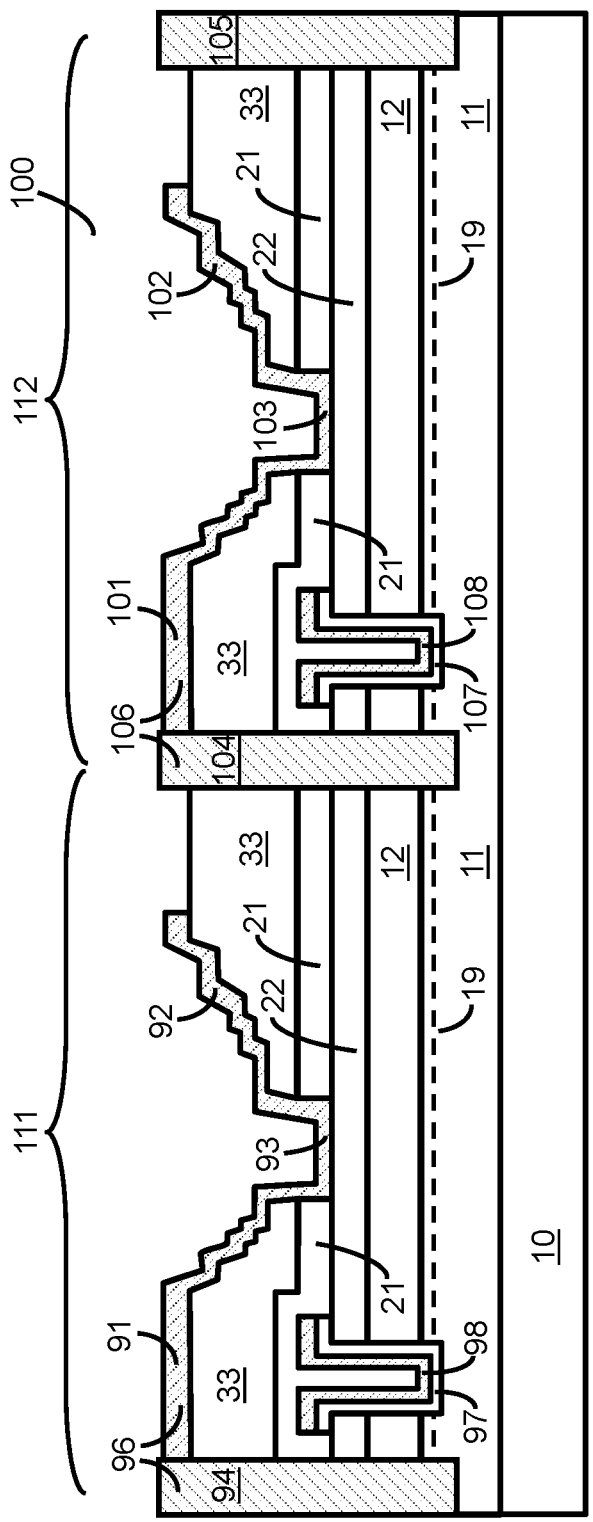
FIG. 21A is a cross-sectional view of an implementation of a half bridge.
Figure 21B:
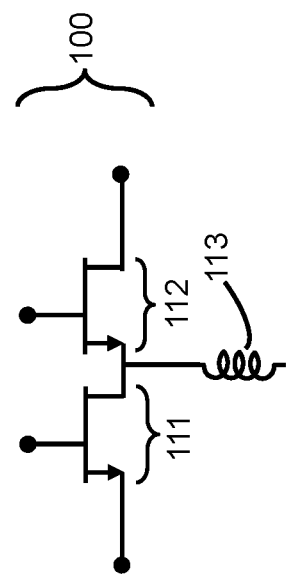
FIG. 21B is a circuit schematic of the half bridge of FIG. 21A connected to an inductive load.

Another implementation of a III-Nitride device 100 is shown in FIGS. 21A and 21B, where FIG. 21A is a cross-sectional view of device 100, and FIG. 21B is a circuit schematic diagram of device 100 connected to an inductive load 113. Device 100 is configured to operate as a half bridge and is operable to switch voltages across inductive load 113. Device 100 includes switches 111 and 112. Switches 111 and 112 are each similar to transistor 70 of FIG. 8, except that switch 111 lacks its own drain contact. Instead, source contact 104 of switch 112 also serves as the drain contact of switch 111. Alternatively, switches 111 and 112 could be provided as any of the enhancement-mode devices shown in FIGS. 5-7 and 9-10, preferably with the source contact of switch 112 and the drain contact of switch 111 formed as a single contact, as in FIG. 21A.

Referring to FIG. 21A, III-Nitride device 100 includes a substrate 10 (although the substrate is optional), a III-Nitride material structure including III-N layers 11 and 12 on the substrate 10, a 2DEG channel 19 in the III-Nitride material structure, an insulator layer 22 on the III-Nitride material structure, an additional dielectric layer 21 on the insulator layer 22, and an electrode-defining layer 33 on the additional dielectric layer 21. In some implementations, additional dielectric layer 21 and insulator layer 22 are optional and may be omitted (not shown). Device 100 also includes a first source contact 94, a second source contact 104, a drain contact 105, a first gate electrode 98 formed on a first gate insulator 97, and a second gate electrode 108 formed on a second gate insulator 107. The first source contact 94 and the first gate electrode 98 serve as the source and gate, respectively, of switch 111. The second gate electrode 108 and the drain contact 105 serve as the gate and drain, respectively, of switch 112. The second source contact 104 serves as both the drain of switch 111 and the source of switch 112, and is also configured to be electrically connected to inductive load 113, as shown in FIG. 21B. The first source contact 94, the second source contact 104, and the drain contact 105 each electrically contact the 2DEG channel 19.

As in previous implementations, switches 111 and 112 each include source-connected field plates 92 and 102, respectively. Field plate 92 is electrically connected to the first source contact 94, such that field plate 92 and the first source contact 94 are part of electrode 96. Field plate 102 is electrically connected to the second source contact 104, such that field plate 102 and the second source contact 104 are part of electrode 106. Similar to the field plate 79 of the transistor 70 in FIG. 8, field plate 92 is at least partially in a recess formed in electrode-defining layer 33 between the first gate electrode 98 and the second source contact 104, and field plate 102 is at least partially in a recess formed in electrode-defining layer 33 between the second gate electrode 108 and the drain contact 105.

Also as in previous implementations, gate recesses for the gates of both switches 111 and 112 are formed through the insulator layer 22 and optionally into the III-N material structure in the gate regions where gates 98 and 108 are formed, gate insulator 97 and gate electrode 98 are deposited in the first recess, and gate insulator 107 and gate electrode 108 are deposited in the second recess. As seen in FIG. 21A, the recesses containing gate electrodes 98 and 108 can be formed through the 2DEG channel 19. The first recess can be formed at least deep enough that when 0V is applied to the first gate electrode 98 relative to the first source contact 94, the device channel in the gate region of switch 111 is depleted of charge, and switch 111 is in the OFF state, but the device channel in the gate region becomes readily conductive when a sufficiently positive voltage is applied to the first gate electrode 98 relative to the first source contact 94. The second recess can be formed at least deep enough that when 0V is applied to the second gate electrode 108 relative to the second source contact 104, the device channel in the gate region of switch 112 is depleted of charge, and switch 112 is in the OFF state, but the device channel in the gate region becomes readily conductive when a sufficiently positive voltage is applied to the second gate electrode 108 relative to the second source contact 104.

Also similar to previously described implementations, in device 100 of FIG. 21A, gate electrodes 98 and 108 can each include a main gate portion and an extending portion. The main gate portion is the portion at the bottom of the recess, and the extending portion is outside the recess and extends from the main gate portion towards the drain contact. The extending portions of gate electrodes 98 and 108, which are over the upper surface of the III-N material structure (layers 11 and 12) and function as gate-connected field plates, can have a larger separation from the 2DEG channel 19 than the portions 93 and 103 of the of source-connected field plates 92 and 102, respectively. As shown, portions 93 and 103 are the portions of field plates 92 and 102, respectively, which are at the bottom of the respective recesses in electrode-defining layer 33.

Although not shown in FIG. 21A, switches 111 and 112 may each also include additional features shown in FIGS. 10A and 10B. For example, each of switches 111 and 112 can include a diode having a substantially smaller reverse bias breakdown voltage than that of the switches 111 and 112. The diodes are configured to stabilize switches 111 and 112 during reverse conduction. As in FIG. 10A, switch 111 and/or switch 112 can further include an additional electrode contacting the 2DEG 19 between the gate electrode and drain contact of the respective switch. Opposite ends of a diode are connected to the source contact and to the additional electrode. As in FIG. 10A, the anode of the diode is electrically connected to the source contact, and the cathode is electrically connected to the additional electrode. As also shown in FIG. 10A, the anode of the diode may be electrically connected directly to the source-connected field plate. Alternatively, the anode of the diode could be electrically connected directly to the source contact 94 or 104, or to a source bus which is connected to multiple source fingers. In the configuration where the anode of the diode is electrically connected directly to the source-connected field plate, when switch 111 or 112 is in reverse conduction mode, with the drain contact biased at a slightly lower voltage than the source contact and the gate biased below the device threshold voltage relative to the source contact, current flows from the source contact into the source-connected field plate, then through the diode into the additional electrode, and then through 2DEG 19 from the additional electrode to the drain contact. In the alternate configuration where the anode of the diode is electrically connected directly to the source contact 94 or 104 or to a source bus which is connected to multiple source fingers, the current flows directly from the source contact into the diode without flowing into the source-connected field plate. When switch 111 or 112 is biased with a large positive voltage on its drain contact relative to its source contact and with its gate below the device threshold voltage relative to its source contact, such that the device is blocking the drain-source voltage, most of the drain-source voltage drops between its drain contact and the additional electrode. Thus the voltage across the diode is much smaller than the total drain-source voltage. As such, the reverse bias breakdown voltage of the diode can be much smaller than the breakdown voltage of the switch 111 or 112 to which the diode is connected, which can result in lower switching losses and lower electromagnetic interference (EMI) during switching, as compared to the case where a higher voltage diode is connected across the entire switch. In one implementation, the reverse bias breakdown voltage of the diode is less than 0.5 times the breakdown voltage of the switch 111 or 112 to which the diode is connected.

Figure 22:
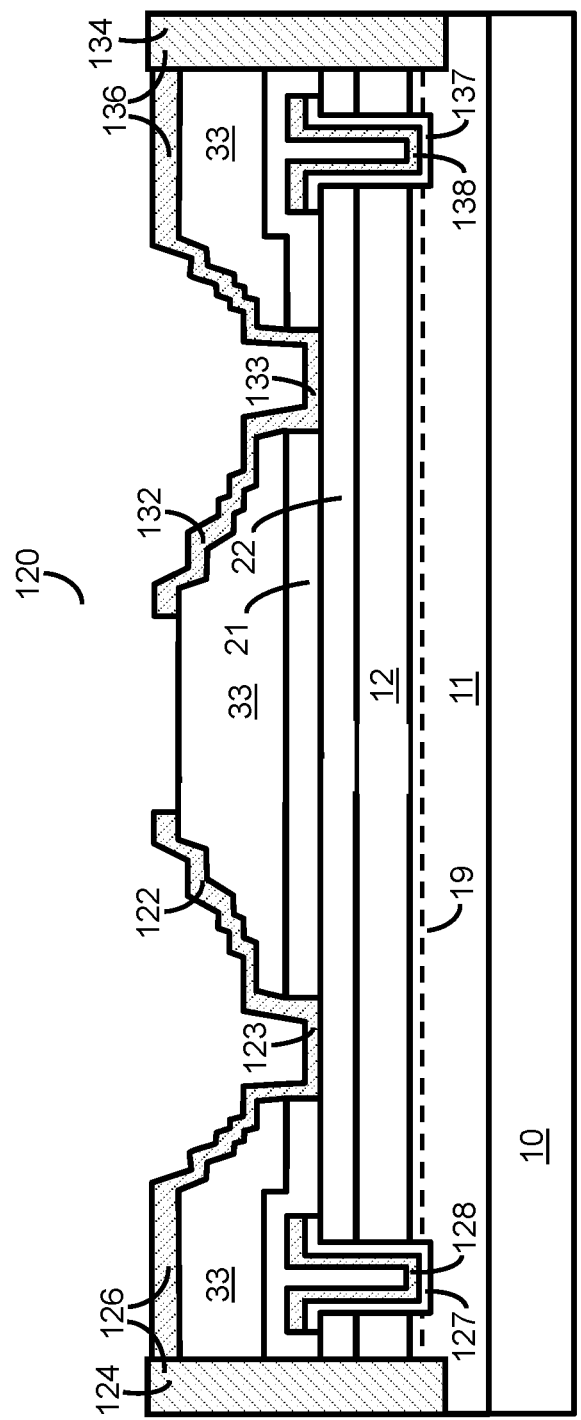
FIGS. 22-24 are cross-sectional views of implementations of bidirectional switches.

Another implementation of a III-Nitride device 120 is shown in FIG. 22. Device 120 is configured to operate as a bidirectional switch, sometimes also referred to as a quadrant switch. Similar to other devices described herein, device 120 includes a substrate 10 (although the substrate is optional), a III-Nitride material structure including III-N layers 11 and 12 on the substrate 10, a 2DEG channel 19 in the III-Nitride material structure, an insulator layer 22 on the III-Nitride material structure, an additional dielectric layer 21 on the insulator layer 22, and an electrode-defining layer 33 on the additional dielectric layer 21. In some implementations, additional dielectric layer 21 and insulator layer 22 are optional and may be omitted (not shown). Device 120 also includes a first source contact 124, a second source contact 134, a first gate electrode 128 formed on a first gate insulator 127, and a second gate electrode 138 formed on a second gate insulator 137. The first source contact 124 and the second source contact 134 each electrically contact the 2DEG channel 19.

As in previous implementations, device 120 also includes source-connected field plates 122 and 132. Field plate 122 is electrically connected to the first source contact 124, such that field plate 122 and the first source contact 124 are part of electrode 126. Field plate 132 is electrically connected to the second source contact 134, such that field plate 132 and the second source contact 134 are part of electrode 136. Similar to the field plate 79 of the transistor 70 in FIG. 8, field plate 122 is at least partially in a first recess formed in electrode-defining layer 33 between the first and second gate electrodes 128 and 138, respectively, and field plate 132 is at least partially in a second recess formed in electrode-defining layer 33 between the first and second gate electrodes 128 and 138, respectively.

Also as in previous implementations, gate recesses for both gates 128 and 138 are formed through the insulator layer 22 and optionally into the III-N material structure in the gate regions where gates 128 and 138 are formed, gate insulator 127 and gate electrode 128 are deposited in the first recess, and gate insulator 137 and gate electrode 138 are deposited in the second recess. As seen in FIG. 22, the recesses containing gate electrodes 128 and 138 can be formed through the 2DEG channel 19. The first gate recess can be formed at least deep enough that when 0V is applied to the first gate electrode 128 relative to the first source contact 124 and the second source contact 134 is biased at a higher voltage than the first source contact 124, the device channel in the gate region corresponding to gate 128 is depleted of charge, and the bidirectional switch is in the OFF state, but the device channel in the gate region corresponding to gate 128 becomes readily conductive when a sufficiently positive voltage is applied to the first gate electrode 128 relative to the first source contact 124 while the second source contact 134 is still biased at a higher voltage than the first source contact 124. The second gate recess can be formed at least deep enough that when 0V is applied to the second gate electrode 138 relative to the second source contact 134 and the second source contact 134 is biased at a lower voltage than the first source contact 124, the device channel in the gate region corresponding to gate 138 is depleted of charge, and the bidirectional switch is in the OFF state, but the device channel in the gate region corresponding to gate 138 becomes readily conductive when a sufficiently positive voltage is applied to the second gate electrode 138 relative to the second source contact 134 while the second source contact 134 is still biased at a lower voltage than the first source contact 124. When gate 128 is biased OFF (i.e., below its threshold voltage relative to contact 124) and gate 138 is biased OFF (i.e., below its threshold voltage relative to contact 134), the device 120 blocks voltage between contacts 124 and 134 of either polarity (i.e., both when the voltage of contact 124 is greater than that of contact 134 and when the voltage of contact 134 is greater than that of contact 124). When gate 128 is biased ON (i.e., above its threshold voltage relative to contact 124) and gate 138 is biased ON (i.e., above its threshold voltage relative to contact 134), the device 120 can conduct current in either direction.

Also similar to previously described implementations, in device 120 of FIG. 22, gate electrodes 128 and 138 can each include a main gate portion and an extending portion. The main gate portion is the portion at the bottom of the recess, and the extending portion is outside the recess and extends from the main gate portion towards the other gate electrode. The extending portions of gate electrodes 128 and 138, which are over the upper surface of the III-N material structure (layers 11 and 12) and function as gate-connected field plates, can have a larger separation from the 2DEG channel 19 than the portions 123 and 133 of the of source-connected field plates 122 and 132, respectively. As shown, portions 123 and 133 are the portions of field plates 122 and 132, respectively, that are at the bottom of the respective recesses in electrode-defining layer 33.

Figure 23:
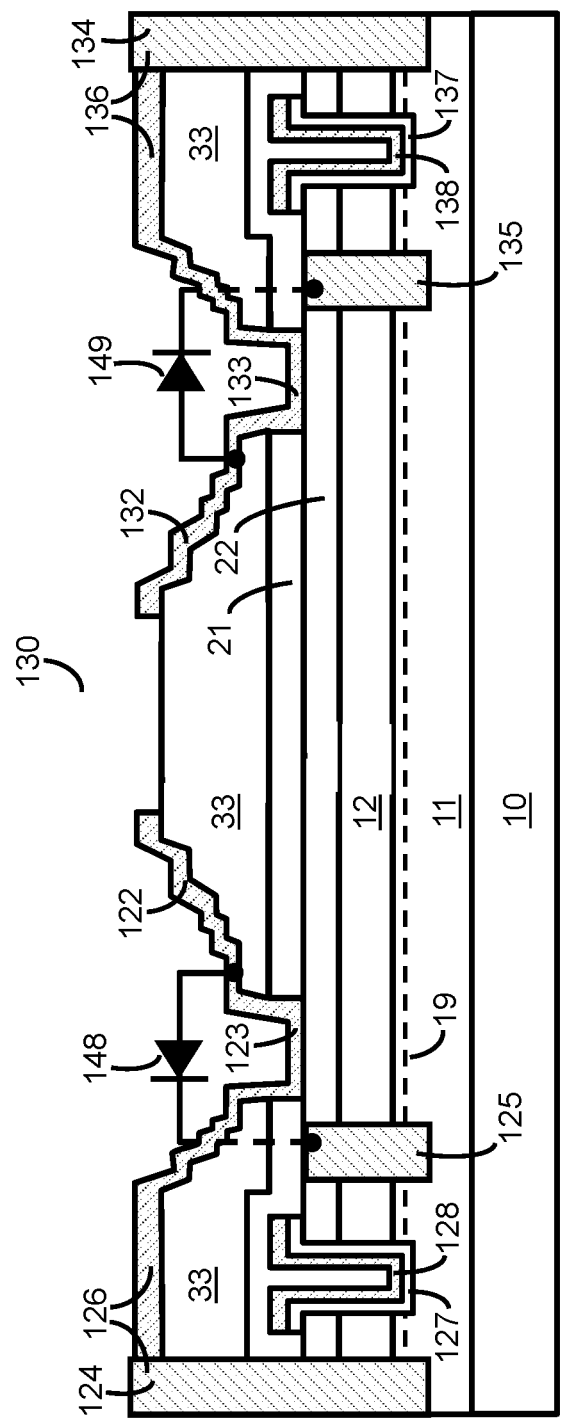

Device 130 in FIG. 23 is also a bidirectional switch and is similar to device 120 of FIG. 22. However, device 130 further includes additional features that are not included in device 120. Specifically, the bidirectional switch 130 further includes diodes 148 and 149, each having a substantially smaller reverse bias breakdown voltage than the breakdown voltage of bidirectional switch 130. The diodes are configured to stabilize the device 130 during operation.

As in previously described implementations, device 130 can further include additional contacts 125 and 135 contacting the 2DEG 19 between the two gate electrodes 128 and 138. Opposite ends of a first diode 148 are connected to the first electrode 126 and to the first additional contact 125, and opposite ends of a second diode 149 are connected to the second electrode 136 and to the second additional contact 135. As illustrated in FIG. 23, the anodes of the diodes 148 and 149 are electrically connected to the electrodes 126 and 136, respectively, and the cathodes are electrically connected to the additional contacts 125 and 135, respectively. As also shown in FIG. 23, the anodes of the diodes may be electrically connected directly to the source-connected field plates. Alternatively, the anodes of the diodes could be electrically connected directly to the contacts 124 and 134, or to a source/drain bus which is connected to multiple source/drain fingers (not shown). In the configuration where the anodes of the diodes are electrically connected directly to the source-connected field plates, when the first gate electrode 128 is biased above the device threshold voltage relative to the first source contact 124, the second source contact is biased at a slightly higher voltage than the first source contact, and the second gate electrode 138 is biased below its threshold voltage relative to the second source contact 134, current flows from the second source contact 134 into the source-connected field plate 132, then through diode 149 into the additional electrode 135, and then through 2DEG 19 from the additional electrode 135 directly into the first source contact 124. In the alternate configuration where the anodes of the diodes are electrically connected directly to the source contacts 124 or 134 or to a source bus which is connected to multiple source fingers, the current flows directly from source contact 134 into diode 149 without flowing into the source-connected field plate 132. In either case, if the voltage on the second gate electrode 138 is then switched high, then the channel beneath gate electrode 138 becomes enhanced, and current flows directly from the second source contact 134 to the first source contact 124 through the 2DEG 19, without any substantial current passing through either of the diodes 148 or 149.

When the device 130 is biased in the off state, for example with a large voltage applied to the second source contact 134 relative to the first source contact 124 and with the first gate 128 biased below its threshold voltage relative to the first source contact 124, the majority of the total voltage dropped across the device is supported/blocked in the III-N material in the region between portions 123 and 133. Only a small voltage is applied across either of the diodes 148 and 149. As such, the reverse bias breakdown voltage of the diodes can be much smaller than the breakdown voltage of the bidirectional switch, which can result in lower switching losses and lower electromagnetic interference (EMI) during switching, as compared to the case where a higher voltage diode is used. In one implementation, the reverse bias breakdown voltage of the diodes is less than 0.3 times the breakdown voltage of the bidirectional switch 130. Note that when the device 130 is biased off in state described above, with a large voltage applied to the second source contact 134 relative to the first source contact 124, the device is in the off state whether the second gate electrode 138 is biased above or below its threshold voltage.

Figure 24:
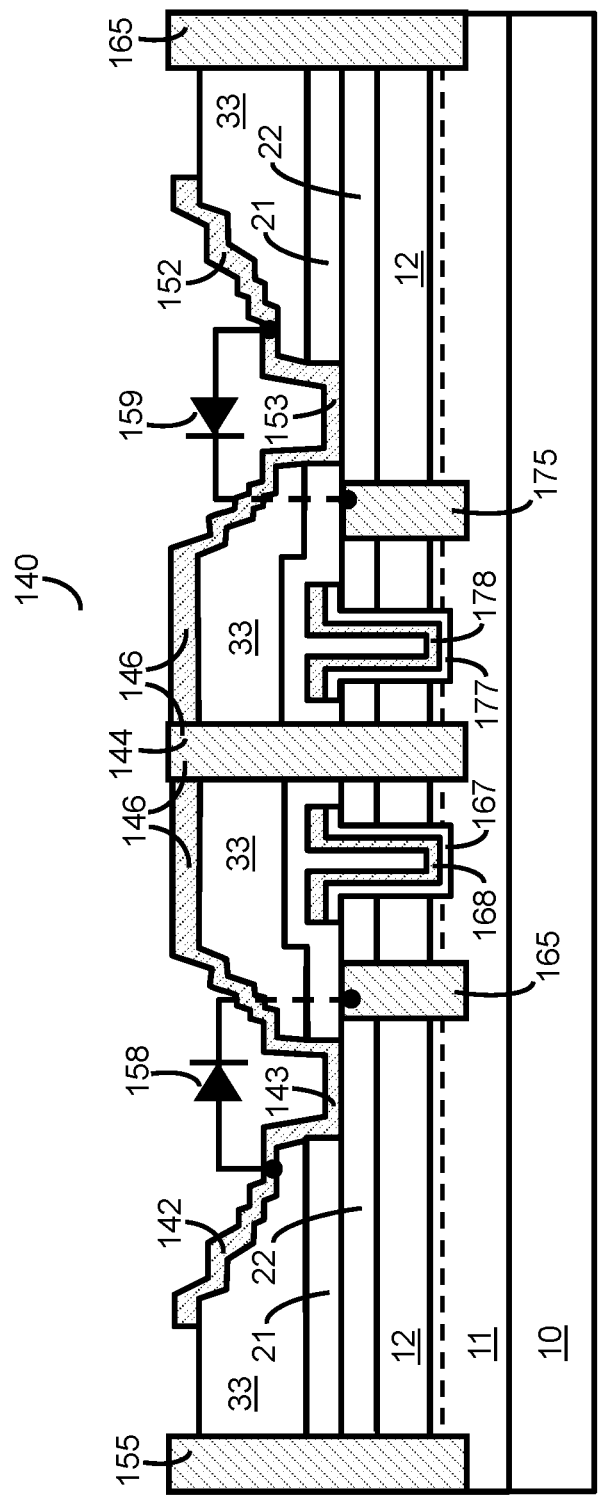

Another implementation of a III-Nitride device 140 is shown in FIG. 24. Like the devices 120 and 130 of FIGS. 22 and 23, respectively, device 140 is configured to operate as a bidirectional switch, sometimes also referred to as a quadrant switch. Similar to other devices described herein, device 140 includes a substrate 10 (although the substrate is optional), a III-Nitride material structure including III-N layers 11 and 12 on the substrate 10, a 2DEG channel 19 in the III-Nitride material structure, an insulator layer 22 on the III-Nitride material structure, an additional dielectric layer 21 on the insulator layer 22, and an electrode-defining layer 33 on the additional dielectric layer 21. In some implementations, additional dielectric layer 21 and insulator layer 22 are optional and may be omitted (not shown). Device 140 also includes a source contact 144, a first drain contact 155, a second drain contact 165, a first gate electrode 168 which is formed on a first gate insulator 167 and is between the source contact 144 and the first drain contact 155, and a second gate electrode 178 which is formed on a second gate insulator 177 and is between the source contact 144 and the second drain contact 165. The source contact 144, the first drain contact 155, and the second drain contact 155 each electrically contact the 2DEG channel 19.

As seen in FIG. 24, device 140 also includes field plates 142 and 152 which are both connected to source contact 144 and extend in opposite directions from one another, with field plate 142 extending towards the first drain contact 155 and field plate 152 extending towards the first drain contact 165. As such, source contact 144, field plate 142, and field plate 152 are all provided as a single electrode 146. Similar to the field plate 79 of the transistor 70 in FIG. 8, field plate 142 is at least partially in a first recess formed in electrode-defining layer 33 between the first gate electrode 168 and the first drain contact 155, and field plate 152 is at least partially in a second recess formed in electrode-defining layer 33 between the second gate electrode 178 and the second drain contact 165.

Also as in previous implementations, gate recesses for both gates 168 and 178 are formed through the insulator layer 22 and optionally into the III-N material structure in the gate regions where gates 168 and 178 are formed, gate insulator 167 and gate electrode 168 are deposited in the first recess, and gate insulator 177 and gate electrode 178 are deposited in the second recess. As seen in FIG. 24, the recesses containing gate electrodes 178 and 188 can be formed through the 2DEG channel 19. The first gate recess can be formed at least deep enough that when 0V is applied to the first gate electrode 168 relative to the source contact 144 and the first drain contact 155 is biased at a higher voltage than the second drain contact 165, the device channel in the gate region corresponding to gate 168 is depleted of charge, and the bidirectional switch is in the OFF state, but the device channel in the gate region corresponding to gate 168 becomes readily conductive when a sufficiently positive voltage is applied to the first gate electrode 168 relative to the source contact 144 while the first drain contact 155 is still at a higher voltage than the second drain contact 165. The second gate recess can be formed at least deep enough that when 0V is applied to the second gate electrode 178 relative to the source contact 144 and the second drain contact 165 is biased at a higher voltage than the first drain contact 155, the device channel in the gate region corresponding to gate 178 is depleted of charge, and the bidirectional switch is in the OFF state, but the device channel in the gate region corresponding to gate 178 becomes readily conductive when a sufficiently positive voltage is applied to the second gate electrode 178 relative to the source contact 144 while the second drain contact 165 is still at a higher voltage than the first drain contact 155. When gate 168 is biased OFF (i.e., below its threshold voltage relative to source contact 144) and gate 178 is biased OFF (i.e., below its threshold voltage relative to source contact 144), the device 140 blocks voltage between drain contacts 155 and 165 of either polarity (i.e., both when the voltage of drain contact 155 is greater than that of drain contact 165 and when the voltage of drain contact 165 is greater than that of drain contact 155). When gate 168 is biased ON (i.e., above its threshold voltage relative to source contact 144) and gate 178 is biased ON (i.e., above its threshold voltage relative to source contact 144), the device 140 can conduct current in either direction.

Also similar to previously described implementations, in device 140 of FIG. 24, gate electrodes 168 and 178 can each include a main gate portion and an extending portion. The main gate portion is the portion at the bottom of the recess, and the extending portion is outside the recess and extends from the main gate portion away from the source contact 144. The extending portions of gate electrodes 168 and 178, which are over the upper surface of the III-N material structure (layers 11 and 12) and function as gate-connected field plates, can have a larger separation from the 2DEG channel 19 than the portions 143 and 153 of the of source-connected field plates 142 and 152, respectively. As shown, portions 143 and 153 are the portions of field plates 142 and 152, respectively, that are at the bottom of the respective recesses in electrode-defining layer 33.

As further illustrated in FIG. 24, the bidirectional switch 140 also includes diodes 158 and 159, each having a substantially smaller reverse bias breakdown voltage than the breakdown voltage of bidirectional switch 140. The diodes are configured to stabilize the device 140 during operation.

As in previously described implementations, device 140 can further include additional contacts 165 and 175 contacting the 2DEG 19. Opposite ends of the first diode 158 are connected to the electrode 146 and to the first additional contact 165, and opposite ends of the second diode 159 are connected to the electrode 146 and to the second additional contact 175. As illustrated in FIG. 24, the anodes of the diodes 158 and 159 are electrically connected to electrode 146, and the cathodes are electrically connected to the additional contacts 165 and 175, respectively. As also shown in FIG. 24, the anodes of the diodes may be electrically connected directly to the source-connected field plates 142 and 152. Alternatively, the anodes of the diodes could be electrically connected directly to the source contact 144, or to a source bus which is connected to multiple source fingers (not shown). In the configuration where the anodes of the diodes are electrically connected directly to the source-connected field plates, when gate electrode 168 is biased above the device threshold voltage relative to the source contact 144, the first drain contact 155 is biased at a higher voltage than the second drain contact 165, and gate electrode 178 is biased below its threshold voltage relative to the source contact 144, current flows from the first drain contact 155 through the 2DEG 19 directly into the source contact 144, then through the source contact 144 into source-connected field plate 152, then through diode 159 into electrode 175, and then through 2DEG 19 from the additional electrode 175 directly into the second drain contact 165. In the alternate configuration where the anodes of the diodes are electrically connected directly to the source contact 144 or to a source bus which is connected to multiple source fingers, the current flows directly from source contact 144 into diode 159 without flowing into the source-connected field plate 152. In either case, if the voltage on the second gate electrode 178 is then switched high, the channel beneath gate electrode 178 becomes enhanced, and current can flow directly from the first drain contact 155 to the second drain contact 165 through the 2DEG 19, without any substantial current passing through either of the diodes 158 or 159.

When the device 140 is biased in the off state, for example with a large voltage applied to the first drain contact 155 relative to the second drain contact 165 and with the first gate 168 biased below its threshold voltage relative to the source contact 144, the majority of the total voltage dropped across the device 140 is supported/blocked in the III-N material in the region between the first drain contact 155 and portion 143 of field plate 142. Only a small voltage is applied across either of the diodes 158 and 159. As such, the reverse bias breakdown voltage of the diodes can be much smaller than the breakdown voltage of the bidirectional switch, which can result in lower switching losses and lower electromagnetic interference (EMI) during switching, as compared to the case where a higher voltage diode is used. In one implementation, the reverse bias breakdown voltage of the diodes is less than 0.3 times the breakdown voltage of the bidirectional switch 130. Note that when the device 140 is biased off in state described above, with a large voltage applied to the first drain contact 155 relative to the second contact 165 and gate 168 biased below its threshold voltage relative to the source contact 144, the device is in the off state whether the second gate electrode 178 is biased above or below its threshold voltage.

While bidirectional switches 120 and 130 of FIGS. 22 and 23, respectively, each include 2 power electrodes (124 and 134) and 2 gate electrodes (128 and 138), bidirectional switch 140 shown in FIG. 24 includes 2 power electrodes (155 and 165), 2 gate electrodes (168 and 178), and an additional source electrode 144. While such a configuration may be more complicated and require a larger footprint as compared to the configurations shown in FIGS. 22 and 23, the configuration of FIG. 24 can result in increased device stability in many applications.

A number of implementations have been described. Nevertheless, it will be understood that various modifications may be made without departing from the spirit and scope of the techniques and devices described herein. Features shown in each of the implementations may be used independently or in combination with one another. Accordingly, other implementations are within the scope of the following claims.

What is claimed is:

1. A bidirectional switch, comprising:
a III-N structure including a conductive channel therein;
a first gate electrode and a second gate electrode, the first and second gate electrodes being on the III-N structure; and
a first source contact and a second source contact, the first and second source contacts electrically contacting the conductive channel, wherein the first and second gate electrodes are each between the first and second source contacts; wherein
the first source contact is part of a first electrode and the second source contact is part of a second electrode, the first electrode including a first portion which is between the first and second gate electrodes, and the second electrode including a second portion that is between the first and second gate electrodes, the first gate electrode including a main gate portion and an extending portion, the extending portion extending from the main gate portion towards the second gate electrode, wherein a separation between the conductive channel and the extending portion of the first gate electrode is greater than a separation between the conductive channel and the first portion of the first electrode; and
a respective gate insulator layer between each of the first and second gate electrodes and the III-N structure.

2. The bidirectional switch of claim 1, further comprising:
a first additional contact between the first gate electrode and the second gate electrode; and
a first diode having an first anode and a first cathode; wherein
the first anode is electrically connected to the first electrode, and the first cathode is electrically connected to the first additional contact.

3. The bidirectional switch of claim 2, wherein the first additional contact electrically contacts the conductive channel.

4. The bidirectional switch of claim 2, further comprising a second additional contact between the first and second gate electrodes and a second diode having a second anode and a second cathode, wherein the second anode is electrically connected to the second electrode, and the second cathode is electrically connected to the second additional contact.

5. The bidirectional switch of claim 2, wherein a reverse bias breakdown voltage of the first diode is smaller than a breakdown voltage of the bidirectional switch.

6. The bidirectional switch of claim 5, wherein the reverse bias breakdown voltage of the first diode is less than 0.3 times the breakdown voltage of the bidirectional switch.

7. A bidirectional switch, comprising:
a III-N structure including a conductive channel therein;
a first gate electrode and a second gate electrode, the first and second gate electrodes being on the III-N structure; and
a first source contact and a second source contact, the first and second source contacts electrically contacting the conductive channel, wherein the first and second gate electrodes are each between the first and second source contacts; wherein
the first source contact is part of a first electrode and the second source contact is part of a second electrode, the first electrode including a first portion which is between the first and second gate electrodes, and the second electrode including a second portion which is between the first and second gate electrodes; and
an insulating material over the III-N structure, the insulating material including a first recess and a second recess, wherein the first portion of the first electrode is in the first recess, and the second portion of the second electrode is in the second recess.

8. The bidirectional switch of claim 7, further comprising:
a first additional contact between the first gate electrode and the second gate electrode; and
a first diode having an first anode and a first cathode; wherein
the first anode is electrically connected to the first electrode, and the first cathode is electrically connected to the first additional contact.

9. The bidirectional switch of claim 8, wherein the first additional contact electrically contacts the conductive channel.

10. The bidirectional switch of claim 8, further comprising a second additional contact between the first and second gate electrodes and a second diode having a second anode and a second cathode, wherein the second anode is electrically connected to the second electrode, and the second cathode is electrically connected to the second additional contact.

11. The bidirectional switch of claim 8, wherein a reverse bias breakdown voltage of the first diode is smaller than a breakdown voltage of the bidirectional switch.

12. The bidirectional switch of claim 11, wherein the reverse bias breakdown voltage of the first diode is less than 0.3 times the breakdown voltage of the bidirectional switch.

13. A bidirectional switch, comprising:
a III-N structure including a conductive channel therein;
a first source contact and a second source contact, wherein the first source contact and the second source contact electrically contact the conductive channel;
a first gate electrode positioned between the first and second source contacts;
a second gate electrode positioned between the first gate electrode and the second source contact;
an insulator layer over the III-N structure, wherein
a first recess is formed through the insulator layer in a first gate region between the first source contact and the second source contact, the first recess comprising a first bottom surface, and the first gate electrode is at least partially in the first recess, and a second recess is formed through the insulator layer in a second gate region between the first recess and the second source contact, the second recess comprising a second bottom surface, and the second gate electrode is at least partially in the second recess;

an electrode defining layer having a thickness, the electrode defining layer being over the insulator layer, wherein a third recess comprising a third bottom surface is formed through a first portion of the electrode defining layer between the first source contact and the second source contact, and a fourth recess comprising a fourth bottom surface is formed through a second portion of the electrode defining layer between the third recess and the second source contact;

a first field plate having a portion that is in the third recess, the first field plate being electrically connected to the first source contact; and a second field plate having a portion that is in the fourth recess, the second field plate being electrically connected to the second source contact.

14. The bidirectional switch of claim 13, wherein the first bottom surface of the first recess has a first edge and a second edge, the first edge being between the first source contact and the second edge, and wherein the third bottom surface of the third recess has a third edge and a fourth edge, the third edge being between the first source contact and the fourth edge; wherein the third edge of the third bottom surface is between the second edge of the first bottom surface and the second source contact.

15. The bidirectional switch of claim 14, wherein the third and fourth recesses each extend through the entire thickness of the electrode defining layer.

16. The bidirectional switch of claim 15, wherein the first field plate contacts the insulator layer in the third recess and the second field plate contacts the insulator layer in the fourth recess.

17. The bidirectional switch of claim 13, further comprising a gate insulator layer in the first recess between the first gate electrode and the III-N structure.

18. The bidirectional switch of claim 17, wherein a portion of the gate insulator layer is over the insulator layer, and the first gate electrode extends over the portion of the gate insulator layer.

19. The bidirectional switch of claim 13, further comprising:

an additional contact between the first gate electrode and the second gate electrode; and a diode having an anode and a cathode; wherein the anode is electrically connected to the first source contact or to the second source contact, and the cathode is electrically connected to the additional contact.

20. The bidirectional switch of claim 19, wherein the additional contact electrically contacts the conductive channel.

21. The bidirectional switch of claim 13, wherein the first or second recess extends into the III-N structure.

22. A bidirectional switch, comprising:

a III-N structure including a conductive channel therein;

a first gate electrode and a second gate electrode, the first and second gate electrodes being on the III-N structure; and a first source contact and a second source contact, the first and second source contacts electrically contacting the conductive channel, wherein the first and second gate electrodes are each between the first and second source contacts; wherein the first source contact is part of a first electrode and the second source contact is part of a second electrode, the first electrode including a first and second portion, the first portion is between the first and second gate electrodes, the second portion is between the first source contact and the first gate electrode, the second electrode including a third and fourth portion, the third portion is between the first and second gate electrodes, and the fourth portion is between the second source contact and the second gate electrode.

23. The bidirectional switch of claim 21, wherein the first gate electrode including a main gate portion and an extending portion, the extending portion extending from the main gate portion towards the second gate electrode, wherein a separation between the conductive channel and the extending portion of the first gate electrode is greater than a separation between the conductive channel and the first portion of the first electrode.

24. The bidirectional switch of claim 21, further comprising an insulating material over the III-N structure, the insulating material including a first recess and a second recess, wherein a portion of the first gate electrode is in the first recess, and a portion of the second gate electrode is in the second recess.

25. The bidirectional switch of claim 23, wherein the first or second recess extends into the III-N structure.

* * * * *